(12) United States Patent
Kim

(10) Patent No.: US 10,903,252 B2
(45) Date of Patent: Jan. 26, 2021

(54) PHOTOELECTRIC CONVERSION DEVICE INCLUDING PEROVSKITE COMPOUND, METHOD OF MANUFACTURING THE SAME, AND IMAGING DEVICE INCLUDING THE SAME

(71) Applicant: Samsung Electronics Co., Ltd., Suwon-si (KR)

(72) Inventor: Yongchul Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 29 days.

(21) Appl. No.: 15/922,103

(22) Filed: Mar. 15, 2018

(65) Prior Publication Data

US 2018/0269235 A1    Sep. 20, 2018

(30) Foreign Application Priority Data

Mar. 17, 2017 (KR) .................. 10-2017-0033871
Jan. 10, 2018 (KR) .................. 10-2018-0003467

(51) Int. Cl.

| H01L 27/142 | (2014.01) |
|---|---|
| H01L 27/146 | (2006.01) |
| H01L 31/18 | (2006.01) |
| H01L 31/0463 | (2014.01) |
| H01L 51/42 | (2006.01) |

(52) U.S. Cl.
CPC ...... *H01L 27/142* (2013.01); *H01L 27/14685* (2013.01); *H01L 31/0463* (2014.12); *H01L 31/18* (2013.01); *H01L 51/4246* (2013.01); *Y02E 10/549* (2013.01)

(58) Field of Classification Search
CPC ............ H01L 27/142; H01L 27/14685; H01L 31/0463
See application file for complete search history.

(56) References Cited

U.S. PATENT DOCUMENTS

| 2004/0129922 | A1 | 7/2004 | Shibuya et al. |
| 2011/0121722 | A1 | 5/2011 | Takashima et al. |
| 2015/0136232 | A1 | 5/2015 | Snaith et al. |
| 2016/0035917 | A1* | 2/2016 | Gershon ............... H01L 51/001 136/252 |
| 2016/0380125 | A1* | 12/2016 | Snaith ................. H01L 51/0032 136/256 |
| 2018/0096795 | A1 | 4/2018 | Kim |

FOREIGN PATENT DOCUMENTS

| EP | 2 846 371 | * | 3/2015 |
| EP | 2846371 | A1 | 3/2015 |
| EP | 2 942 826 | * | 11/2015 |

(Continued)

OTHER PUBLICATIONS

Yu et al., High-Performance Planar Perovskite Optoelectronic Devices: A Morphological and Interfacial Control by Polar Solvent Treatment, Advanced Materials, Material Views, pp. 1-9 (Year: 2015).*

(Continued)

*Primary Examiner* — Jayne L Mershon
(74) *Attorney, Agent, or Firm* — Cantor Colburn LLP

(57) ABSTRACT

A photoelectric conversion device including a perovskite compound, a method of manufacturing the same and an imaging device including the same.

24 Claims, 14 Drawing Sheets

(56) References Cited

FOREIGN PATENT DOCUMENTS

| EP | 2942826 A2 | | 11/2015 |
|----|------------|---|---------|
| EP | 3136450 A1 | | 3/2017 |
| JP | 2003-113372 | * | 4/2003 |
| JP | 3714918 B2 | | 11/2005 |
| JP | 5093694 B2 | | 12/2012 |
| KR | 1666563 B1 | | 10/2016 |
| WO | 2016115602 A1 | | 7/2016 |

OTHER PUBLICATIONS

Haotong Wei et al., "Sensitive X-ray detectors made of methylammmonium lead tribromide perovskite single cystals", Nature Photonics, Mar. 21, 2016, pp. 333-339, vol. 10.

Patric Buchele et al., "X-ray imaging with scintillator-sensitized hybrid organic photodetectors", Nature Photonics, Nov. 9, 2015, pp. 843-848, vol. 9.

Sergii Yakunin et al., "Detection of X-ray photons by solution-processed lead halide perovskites", Nature Photonics, May 25, 2015, pp. 444-449, vol. 9.

Malinkiewicz, et al., "Perovskite solar cells employing organic charge-transport layers", Nature Photonics, 2013, pp. 1-5.

Schulz et al., "Interface energetics in organo-metal halide perovskite-based photovoltaic cells", Energy & Environmental Science, 7, 2014, pp. 1377-1381.

* cited by examiner

PHOTOELECTRIC CONVERSION DEVICE INCLUDING PEROVSKITE COMPOUND, METHOD OF MANUFACTURING THE SAME, AND IMAGING DEVICE INCLUDING THE SAME

CROSS-REFERENCE TO RELATED APPLICATION

This application claims priority to and the benefit of Korean Patent Application No. 10-2017-0033871 filed on Mar. 17, 2017 and Korean Patent Application No. 10-2018-0003467 filed on Jan. 10, 2018 in the Korean Intellectual Property Office, and all the benefits accruing therefrom under 35 U.S.C. § 119, the contents of which are incorporated herein by reference in their entireties.

BACKGROUND

1. Field

The present disclosure relates to a photoelectric conversion device including a perovskite compound, method of manufacturing the same and an imaging device including the same.

2. Description of the Related Art

A photoelectric conversion device refers to a device which converts an optical signal to an electrical signal. A photoelectric conversion device may use photoelectric effects, for example, a photoconductive effect and a photovoltaic effect for converting an optical signal to an electrical signal.

For example, such a photoelectric conversion device may be used in an imaging device. The imaging device may include photoelectric conversion devices arranged two-dimensionally on transistors, and collect electrical signals generated from the photoelectric conversion devices.

SUMMARY

Provided are a photoelectric conversion device including a perovskite compound, and an imaging device including the same, and more particularly, a photoelectric conversion device including a perovskite compound in an electron blocking layer and a hole blocking layer, and an imaging device including the photoelectric conversion device.

Additional aspects will be set forth in part in the description which follows and, in part, will be apparent from the description, or may be learned by practice of the presented example embodiments.

According to an aspect of an example embodiment, a photoelectric conversion device includes: a first conductive layer; a second conductive layer; a photoelectric conversion layer between the first conductive layer and the second conductive layer; an electron blocking layer between the photoelectric conversion layer and the first conductive layer; and a hole blocking layer between the photoelectric conversion layer and the second conductive layer, wherein the electron blocking layer includes a first perovskite compound represented by Formula 1, and the hole blocking layer includes a second perovskite compound represented by Formula 2:

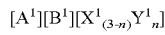                     Formula 1 wherein, in Formula 1, $A^1$ includes a monovalent organic cation, a monovalent inorganic cation, or a combination thereof, $B^1$ includes a divalent inorganic cation, $X^1$ and $Y^1$ each independently includes a monovalent anion, and n is a real number satisfying $0 \leq n \leq 3$, and

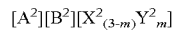                     Formula 2 wherein, in Formula 2, $A^2$ includes a monovalent organic cation, a monovalent inorganic cation, or a combination thereof, $B^2$ includes a divalent inorganic cation, $X^2$ and $Y^2$ each independently includes a monovalent anion, and m is a real number satisfying $0 \leq m \leq 3$.

According to an aspect of an example embodiment, a method of manufacturing a photoelectric conversion device includes: forming a first conductive layer; forming an electron blocking layer including the first perovskite compound represented by Formula 1 on the first conductive layer; forming a photoelectric conversion layer on the electron blocking layer; forming a hole blocking layer including the second perovskite compound represented by Formula 2 on the photoelectric conversion layer; and forming a second conductive layer on the hole blocking layer.

According to an aspect of an example embodiment, an imaging device includes a light irradiation unit, a photodetector unit, and a control unit, the photodetector unit including the above-described photoelectric conversion device.

BRIEF DESCRIPTION OF THE DRAWINGS

These and/or other aspects will become apparent and more readily appreciated from the following description of the example embodiments, taken in conjunction with the accompanying drawings in which:

FIGS. 12A to 12C are scanning electron microscope (SEM) images of the photoelectric conversion layer in the photoelectric conversion device of Example 1, wherein FIGS. 12B and 12C are magnified images of FIGS. 12A and 12B, respectively, and a scale bar length in FIG. 12A is 400 micrometers (μm);

FIGS. 14A and 14B are SEM images of a hole blocking layer in the photoelectric conversion device of Example 2, wherein FIG. 14B is a magnified image of FIG. 14A.

DETAILED DESCRIPTION

Figure 1:
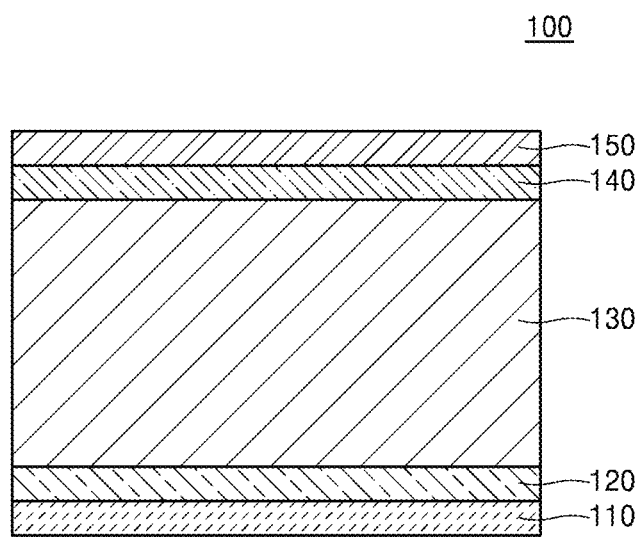
FIG. 1 is a schematic cross-sectional side view of a photoelectric conversion device according to an embodiment.

Reference will now be made in detail to example embodiments of a photoelectric conversion device, a method of operating the photoelectric conversion device, and a method of manufacturing the photoelectric conversion device, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. In the drawings, like reference numerals denote like elements throughout, and thus redundant description thereof will be omitted. In the drawings, the sizes of elements are exaggerated or reduced for ease of description. As used herein, the term "and/or" includes any and all combinations of one or more of the associated listed items. Expressions such as "at least one of," when preceding a list of elements, modify the entire list of elements and do not modify the individual elements of the list.

It will also be understood that when an element such as a layer, a region, or a component is referred to as being "on" another element, it can be "directly on" the other element, or intervening layers, regions, or components may also be present.

Although the terms "first", "second", etc., may be used herein to describe various elements, components, regions, and/or layers, these elements, components, regions, and/or layers should not be limited by these terms. These terms are used only to distinguish one component from another, not for purposes of limitation.

General and widely used terms have been employed herein, in consideration of functions provided in the present disclosure, and may vary according to an intention of one of ordinary skill in the art, a precedent, or emergence of new technologies. Additionally, in some cases, an applicant may arbitrarily select specific terms. Then, the applicant will provide the meaning of the terms in the description of the present disclosure. Accordingly, it will be understood that the terms used herein should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, an alkyl group indicates a completely saturated, branched or unbranched (or a straight or linear) hydrocarbon group.

Non-limiting examples of the alkyl group may include a methyl group, an ethyl group, a n-propyl group, an isopropyl group, a n-butyl group, an isobutyl group, a sec-butyl group, a t-butyl group, an isopentyl group, a neopentyl group, an iso-amyl group, a n-hexyl group, a 3-methylhexyl group, a 2,2-dimethylpentyl group, a 2,3-dimethylpentyl group, and a n-heptyl group.

At least one hydrogen atom of the alkyl group may be substituted with a halogen atom, a $C_1$-$C_{20}$ alkyl group substituted with a halogen atom (for example, $CF_3$, $CH_3CF_2$, $CH_2F$, $CCl_3$, and the like), a $C_1$-$C_{20}$ alkoxy group, a $C_2$-$C_{20}$ alkoxyalkyl group, a hydroxyl group (—OH), a nitro group (—$NO_2$), a cyano group (—CN), an amino group (—$NH_2$), an alkylamino group (RNH— wherein R is a $C_1$-$C_{10}$ alkyl group), a dialkylamino group ($R_2$NH— wherein each R is the same or different $C_1$-$C_{10}$ alkyl group), an amidino group (—C(=NH)$NH_2$), a hydrazino group (—$NHNH_2$), a hydrazono group (=N—$NH_2$), a carbamoyl group (—C(O)$NH_2$), a carboxyl group or a salt thereof (—C(=O)OX wherein X is a hydrogen or a counterion), a sulfonyl group (—S(=O)$_2$—), a sulfamoyl group ($NH_2$—$SO_2$—), a sulfonic acid group or a salt thereof ((—$SO_3X_2$ wherein X is a hydrogen or a counterion), a phosphoric acid or a salt thereof (—$PO_3X_2$ wherein X is a hydrogen or a counterion), a tosyl ($CH_3C_6H_4SO_2$—), a $C_1$-$C_{20}$ alkyl group, a $C_2$-$C_{20}$ alkenyl group, a $C_2$-$C_{20}$ alkynyl group, a $C_1$-$C_{20}$ heteroalkyl group, a $C_6$-$C_{20}$ aryl group, a $C_6$-$C_{20}$ arylalkyl group, a $C_4$-$C_{20}$ heteroaryl group, a $C_5$-$C_{20}$ heteroarylalkyl group, a $C_4$-$C_{20}$ heteroaryloxy group, a $C_5$-$C_{20}$ heteroaryloxyalkyl group, or a $C_5$-$C_{20}$ heteroarylalkyl group, provided that the substituted atom's normal valence is not exceeded.

As used herein, an alkenyl group refers to an aliphatic hydrocarbon including one or more double bonds. An alkynyl group refers to an aliphatic hydrocarbon including one or more triple bonds. At least one hydrogen atom in the alkenyl or alkynyl group may be substituted with one of the substituents as described above in connection with the alkyl group. The indicated total number of carbon atoms for a group does not include any substituents if present.

As used herein, an alkynyl group means a straight or branched chain, monovalent hydrocarbon group having at least one carbon-carbon triple bond (e.g., ethynyl).

As used herein, an alkoxy group indicates "alkyl-O—", wherein the alkyl group may be the same as described above. Non-limiting examples of the alkoxy group may include a methoxy group, an ethoxy group, a propoxy group, a 2-propoxy group, a butoxy group, a t-butoxy group, a pentyloxy group, and a hexyloxy group. At least one hydrogen atom in the alkoxy group may be substituted with one of the substituents as described above in connection with the alkyl group.

As used herein, the term "perovskite compound" refers to a compound represented by, for example, the formula of AB'$X_3$, wherein A and B' are cations having different sizes, and X is an anion. In the unit cell of the perovskite compound, a site of the cation A may be at (0,0,0), a site of the cation B' may be at (½,½,½), and a site of the anion X may be at (½,½,0). The perovskite compound may have a twisted structure with less symmetry, compared to the ideal symmetric structure of calcium titanium oxide ($CaTiO_3$), depending on types of A, B', and X. It will be understood that the perovskite compound used herein may encompass a compound having the ideal symmetric structure and a compound having a twisted structure with low symmetry.

FIG. 1 is a schematic cross-sectional side view of a photoelectric conversion device 100 according to an embodiment.

Referring to FIG. 1, the photoelectric conversion device 100 may include a first conductive layer 110, a second conductive layer 150, an electron blocking layer 120, a photoelectric conversion layer 130, and a hole blocking layer 140.

The electron blocking layer 120, the photoelectric conversion layer 130 and the hole blocking layer 140 may be between the first conductive layer 110 and the second conductive layer 150.

The electron blocking layer 120 may be between the first conductive layer 110 and the photoelectric conversion layer 130.

The hole blocking layer 140 may be between the second conductive layer 150 and the photoelectric conversion layer 130.

The electron blocking layer 120 may include a first perovskite compound represented by Formula 1

In Formula 1, $A^1$ may include a monovalent organic cation, a monovalent inorganic cation, or any combination thereof.

For example, in Formula 1, $A^1$ may be i) a monovalent organic cation, ii) a monovalent inorganic cation, iii) at least two different monovalent organic cations, iv) at least two different monovalent inorganic cations, or v) any combination including a monovalent organic cation or a monovalent inorganic cation. However, example embodiments are not limited thereto.

In example embodiments, in Formula 1, $A^1$ may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted nitrogen-containing 5-membered cyclic monovalent cation, a substituted or unsubstituted nitrogen-containing 6-membered cyclic monovalent cation, a substituted or unsubstituted 7-membered cyclic monovalent cation, $Li^+$, $Na^+$, $K^+$, $Rb^+$, $Cs^+$, $Fr^+$, or any combination thereof;

$R_1$ to $R_5$, at least one substituent of the substituted nitrogen-containing 5-membered cyclic monovalent cation, at least one substituent of the substituted nitrogen-containing 6-membered cyclic monovalent cation, and at least one substituent of the substituted 7-membered cyclic monovalent cation may each independently include hydrogen, deuterium (-D), —F, —Cl, —Br, —I, a hydroxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, or —N($Q_1$)($Q_2$); and $Q_1$ and $Q_2$ may each independently include hydrogen, deuterium, a hydroxyl group, a $C_1$-$C_{20}$ alkyl group, a $C_2$-$C_{20}$ alkenyl group, a $C_2$-$C_{20}$ alkynyl group, a $C_1$-$C_{20}$ alkoxy group, or a $C_6$-$C_{20}$ aryl group. However, example embodiments are not limited thereto.

In example embodiments, in Formula 1, $A^1$ may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienium, a substituted or unsubstituted imidazolium, a substituted or unsubstituted pyridinium, a substituted or unsubstituted pyridazinium, a substituted or unsubstituted pyrimidinium, a substituted or unsubstituted pyrazinium, a substituted or unsubstituted pyrazolium, a substituted or unsubstituted thiazolium, a substituted or unsubstituted oxazolium, a substituted or unsubstituted piperidinium, a substituted or unsubstituted pyrrolidinium, a substituted or unsubstituted pyrrolinium, a substituted or unsubstituted pyrrolium, a substituted or unsubstituted triazolium, Li$^+$, Na$^+$, K$^+$, Rb$^+$, Cs$^+$, Fr$^+$, or any combination thereof;

$R_1$ to $R_5$, at least one substituent of the substituted cycloheptatrienium, at least one substituent of the substituted imidazolium, at least one substituent of the substituted pyridinium, at least one substituent of the substituted pyridazinium, at least one substituent of the substituted pyrimidinium, at least one substituent of the substituted pyrazinium, at least one substituent of the substituted pyrazolium, at least one substituent of the substituted thiazolium, at least one substituent of the substituted oxazolium, at least one substituent of the substituted piperidinium, at least one substituent of the substituted pyrrolidinium, at least one substituent of the substituted pyrrolinium, at least one substituent of the substituted pyrrolium, and at least one substituent of the substituted triazolium may each independently include hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, and a $C_1$-$C_{20}$ alkoxy group;

a $C_1$-$C_{20}$ alkyl group, a $C_2$-$C_{10}$ alkenyl group, a $C_2$-$C_{10}$ alkynyl group, and a $C_1$-$C_{20}$ alkoxy group, each substituted with deuterium, —F, —Cl, —Br, —I, or a hydroxyl group;

a phenyl group, a naphthyl group, a biphenyl group, and a terphenyl group;

a phenyl group, a naphthyl group, a biphenyl group, and a terphenyl group, each substituted with deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, or a $C_1$-$C_{20}$ alkoxy group; or —N($Q_1$)($Q_2$); and $Q_1$ and $Q_2$ may each independently be hydrogen, deuterium, a $C_1$-$C_{20}$ alkyl group, a $C_2$-$C_{10}$ alkenyl group, a $C_2$-$C_{10}$ alkynyl group, a $C_1$-$C_{20}$ alkoxy group, a phenyl group, a naphthyl group, a biphenyl group, or a terphenyl group. However, example embodiments are not limited thereto.

In example embodiments, in Formula 1, $A^1$ may be $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)—NR_4R_5)^+$, a substituted or unsubstituted cycloheptatrienium, Li$^+$, Na$^+$, K$^+$, Rb$^+$, Cs$^+$, Fr$^+$, or any combination thereof;

$R_1$ to $R_5$, and at least one substituent of the substituted cycloheptatrienium may each independently be hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, a $C_1$-$C_{20}$ alkoxy group, or —N($Q_1$)($Q_2$); and $Q_1$ and $Q_2$ may each independently be hydrogen, deuterium, a $C_1$-$C_{20}$ alkyl group, a $C_2$-$C_{10}$ alkenyl group, a $C_2$-$C_{10}$ alkynyl group, or a $C_1$-$C_{20}$ alkoxy group. However, example embodiments are not limited thereto.

In example embodiments, in Formula 1, $A^1$ may be $(CH_3NH_3)^+$, $((CH_3)_2PH_2)^+$, $(CH_3AsH_3)^+$, $(NH_4)^+$, $(CH_3SbH_3)^+$, $(PH_4)^+$, $(PF_4)^+$, $(CH_3PH_3)^+$, $(C_7H_7)^+$, $(SbH_4)^+$, $(AsH_4)^+$, $(NCl_4)^+$, $(NH_3OH)^+$, $(NH_3NH_2)^+$, $(CH(NH_2)_2)^+$, $(C_3N_2H_5)^+$, $((CH_3)_2NH_2)^+$, $(NC_4H_8)^+$, $((CH_3CH_2)NH_3)^+$, $((NH_2)_3C)^+$, $((CH_3CH_2CH_2CH_2)NH_3)^+$, $(NH_2CHNH_2)^+$, Li$^+$, Na$^+$, K$^+$, Rb$^+$, Cs$^+$, Fr$^+$, or any combination thereof. However, example embodiments are not limited thereto.

In example embodiments, in Formula 1, $A^1$ may be $(CH_3NH_3)^+$, $((CH_3CH_2CH_2CH_2)NH_3)^+$, $(NH_2CHNH_2)^+$, K$^+$, Rb$^+$, Cs$^+$, or any combination thereof. However, example embodiments are not limited thereto.

In Formula 1, $B^1$ may include a divalent inorganic cation.

For example, in Formula 1, $B^1$ may be i) a divalent inorganic cation, or ii) a combination of at least two different divalent inorganic cations. However, example embodiments are not limited thereto.

In example embodiments, in Formula 1, $B^1$ may be a divalent cation of a rare earth metal, a divalent cation of an alkali earth metal, a divalent cation of a transition metal, a divalent cation of a late transition metal, or any combination thereof. However, example embodiments are not limited thereto.

In example embodiments, in Formula 1, $B^1$ may be La$^{2+}$, Ce$^{2+}$, Pr$^{2+}$, Nd$^{2+}$, Pm$^{2+}$, Sm$^{2+}$, Eu$^{2+}$, Gd$^{2+}$, Tb$^{2+}$, Dy$^{2+}$, Ho$^{2+}$, Er$^{2+}$, Tm$^{2+}$, Yb$^{2+}$, Lu$^{2+}$, Be$^{2+}$, Mg$^{2+}$, Ca$^{2+}$, Sr$^{2+}$, Ba$^{2+}$, Ra$^{2+}$, Pb$^{2+}$, Sn$^{2+}$, or any combination thereof. However, example embodiments are not limited thereto.

In example embodiments, in Formula 1, $B^1$ may be Pb$^{2+}$, Sn$^{2+}$, or any combination thereof. However, example embodiments are not limited thereto.

In example embodiments, in Formula 1, $B^1$ may be Pb$^{2+}$. However, example embodiments are not limited thereto.

For example, in Formula 1, $X^1$ and $Y^1$ may each independently include a monovalent anion, wherein $X^1$ and $Y^1$ may be the same as or different from each other.

For example, in Formula 1, $X^1$ and $Y^1$ may each independently be i) a monovalent anion, or ii) any combination of at least two different monovalent anions. However, example embodiments are not limited thereto.

In example embodiments, in Formula 1, $X^1$ and $Y^1$ may each independently include a halide anion. However, example embodiments are not limited thereto.

In example embodiments, in Formula 1, $X^1$ and $Y^1$ may each independently be Cl$^-$, Br$^-$, or I$^-$. However, example embodiments are not limited thereto.

In Formula 1, n may be a real number satisfying $0 \leq n \leq 3$.

For example, in Formula 1, n may be a real number satisfying $0 \leq n < 3$. However, example embodiments are not limited thereto.

The hole blocking layer 140 may include second a perovskite compound represented by Formula 2

$[A_2][B_2][X^2_{(3-m)}Y^2_m]$.                    Formula 2

In Formula 2, $A^2$ may be defined substantially the same as $A^1$ in Formula 1 as described above, $B^2$ may be defined substantially the same as $B^1$ in Formula 1 as described above, $X^2$ may be defined substantially the same as $X^1$ in Formula 1 as described above, $Y^2$ may be defined substantially the same as $Y^1$ in Formula 1 as described above, and m may be defined substantially the same as n in Formula 1 as described above.

In example embodiments, the first perovskite compound represented by Formula 1 and the second perovskite compound represented by Formula 2 may each independently be $CH_3NH_3PbI_3$, $CH_3NH_3PbBr_3$, $CH_3NH_3PbBr_{(3-o)}I_o$, $CH_3NH_3PbCl_{(3-o)}Br_o$, $CH_3NH_3PbCl_{(3-o)}I_o$, $CsPbI_3$, $CsPbBr_3$, $CH_3CH_2CH_2CH_2NH_3PbBr_3$, $NH_2CHNH_2PbBr_3$, $NH_2CHNH_2PbBr_{(3-o)}I_o$, $[CH_3NH_3]_{(1-x)}[NH_2CHNH_2]_xPbBr_3$, or $[CH_3NH_3]_{(1-x)}[NH_2CHNH_2]_xPbBr_{(3-o)}I_o$, wherein o may be a real number greater than 0 and less than 3, and x may be a real number greater than 0 and less than 1. However, example embodiments are not limited thereto.

The electron blocking layer 120 may further include a polymer together with the first perovskite compound represented by Formula 1.

The hole blocking layer 140 may further include a polymer together with the second perovskite compound represented by Formula 2.

The polymer may be soluble and miscible with the first perovskite compound or the second perovskite compound in a solvent. For example, the polymer may be a polar polymer soluble and miscible in a polar solvent.

An amount of the polar polymer in the electron blocking layer 120 may be about 5 parts to about 60 parts by weight, about 10 parts to about 50 parts by weight, or about 20 parts to about 40 parts by weight, based on 100 parts by weight of the first perovskite compound represented by Formula 1. While not wanting to be bound by theory, it is understood that when the amount of the polar polymer in the electron blocking layer 120 is within these ranges, the electron blocking layer 120 may have improved electron blocking ability, for example, due to improved adhesion to the photoelectric conversion layer 130. Accordingly, the electron blocking layer 120 may increase photoelectric conversion efficiency by reducing dark current.

An amount of the polar polymer in the hole blocking layer 140 may be about 5 parts to about 60 parts by weight, about 10 parts to about 50 parts by weight, or about 20 parts to about 40 parts by weight, based on 100 parts by weight of the second perovskite compound represented by Formula 2. While not wanting to be bound by theory, it is understood that when the amount of the polar polymer in the hole blocking layer 140 is within these ranges, the hole blocking layer 140 may have improved hole blocking ability, for example, due to improved adhesion to the photoelectric conversion layer 130. Accordingly, the hole blocking layer 140 may increase photoelectric conversion efficiency by reducing dark current.

For example, the polar polymer may be polyamic acid, polyimide, polyvinyl alcohol (PVA), polyacrylic acid, polyhydroxyethyl methacrylate (PHEMA), polymethyl methacrylate (PMMA), polyacrylate, or polyacrylonitrile (PAN). However, example embodiments are not limited thereto. The polymer may include a copolymer of the above-listed polymer materials.

While not wanting to be bound by theory, it is understood that the polymer may further improve adhesion of the electron blocking layer 120 or the hole blocking layer 140 by being mixed with the first perovskite compound or the second perovskite compound, further improving electron blocking ability or hole blocking ability and consequentially leading to reduced dark current and improved photoelectric conversion efficiency. For example, the polymer may form a complex with a perovskite compound in the electron blocking layer 120 or the hole blocking layer 140. For example, in the electron blocking layer 120 or the hole blocking layer 140, the polymer may be in a separate phase from the perovskite phase and thus form separate double layers.

The solvent may include any of various suitable solvents. For example, the solvent may include water, methanol, ethanol, acetone, benzene, toluene, hexane, acetonitrile, dimethylformamide (DMF), dimethyl sulfoxide (DMSO), γ-butyrolactone, N-methylpyrrolidone (NMP), methylene chloride ($CH_2Cl_2$), chloroform ($CH_3Cl$), tetrahydrofuran (THF), or any mixture thereof.

In example embodiments, the electron blocking layer 120 may further include polyimide as a polar polymer together with $CH_3NH_3PbI_3$. However, example embodiments are not limited thereto. The $CH_3NH_3PbI_3$ may be polycrystalline. However, example embodiments are not limited thereto. For example, the electron blocking layer 120 may include a $CH_3NH_3PbI_3$-polyimide complex. However, example embodiments are not limited thereto. For example, the electron blocking layer 120 may include two separate $CH_3NH_3PbI_3$ and polyimide layers. However, example embodiments are not limited thereto.

In example embodiments, the hole blocking layer 140 may further include polyimide as a polar polymer together with $CH_3NH_3PbBr_3$. However, example embodiments are not limited thereto. The $CH_3NH_3PbBr_3$ may be polycrystalline. However, example embodiments are not limited thereto. For example, the hole blocking layer 140 may include a $CH_3NH_3PbBr_3$-polyimide complex. However, example embodiments are not limited thereto. For example, the hole blocking layer 140 may include two separate $CH_3NH_3PbBr_3$ and polyimide layers. However, example embodiments are not limited thereto.

In example embodiments, a surface of the hole blocking layer 140 may have various regular or irregular patterns, including, for example, a square star pattern, a butterfly pattern, a starfish pattern, a sawtooth pattern, and a clover pattern. However, example embodiments are not limited thereto.

The electron blocking layer 120 may have a thickness of about 1 nm to about 10 μm. For example, the electron blocking layer 120 may have a thickness of about 10 nm to about 10 μm or about 50 nm to about 5000 nm. However, example embodiments are not limited thereto. When the thickness of the electron blocking layer 120 is within these ranges, the photoelectric conversion device may have a satisfactory dark current reduction effect and a photoelectric conversion efficiency that is maintained at a similar level without significant reduction.

The electron blocking layer 120 may be formed as described below.

The hole blocking layer 140 may have a thickness of about 1 nm to about 10 μm. For example, the hole blocking layer 140 may have a thickness of about 10 nm to about 10 μm or about 50 nm to about 5000 nm. However, example embodiments are not limited thereto. When the thickness of the hole blocking layer 140 is within these ranges, the photoelectric conversion device may have a satisfactory dark current reduction effect and a photoelectric conversion efficiency that is maintained at a similar level without significant reduction.

The hole blocking layer 140 may be formed as described below.

The photoelectric conversion layer 130 may include a semiconductor material as a photoactive material, for example, amorphous Se, CdZnTe, GaAs, InP, Si, or any combination thereof. However, example embodiments are not limited thereto.

In example embodiments, the photoelectric conversion layer 130 may include a third perovskite compound represented by Formula 3, which will be described later, as the photoactive material. However, example embodiments are not limited thereto.

A method of forming the photoelectric conversion layer 130 is not specifically limited, and any of a variety of suitable methods, including a solution process such as doctor blade coating or deposition may be used.

Figure 2A:
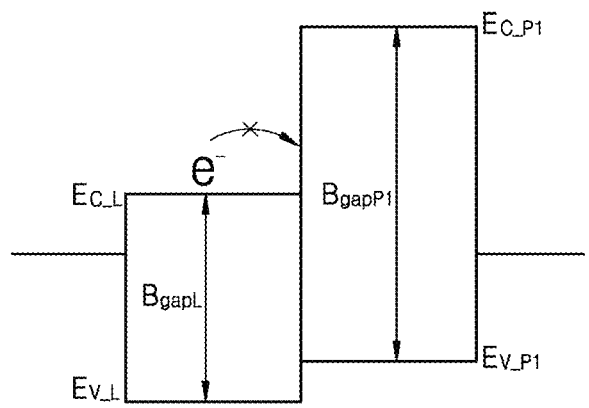
FIGS. 2A and 2B are schematic illustrations of energy levels of a photoactive material in a photoelectric conversion layer, and a first perovskite compound in an electron blocking layer.
Figure 2B:
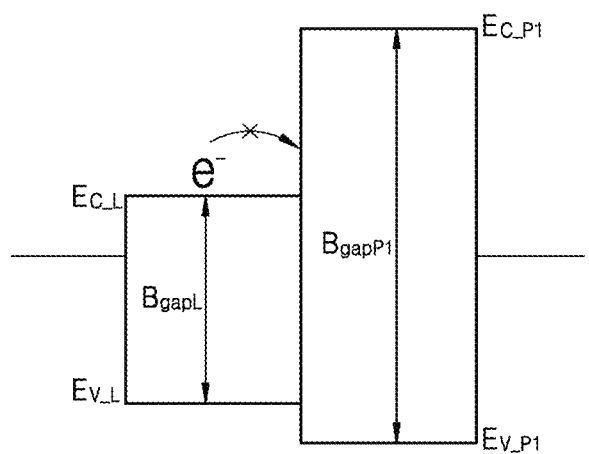

FIGS. 2A and 2B are schematic illustrations of energy levels of the photoactive material included in the photoelectric conversion layer 130, and the first perovskite compound included in the electron blocking layer 120.

Referring to FIGS. 2A and 2B, the lowest unoccupied molecular orbital (LUMO) energy level ($E_{C\_L}$) of the photoactive material may be equal to or less than the LUMO energy level ($E_{C\_P1}$) of the first perovskite compound. When an external voltage is applied to a photoelectric conversion device, injection of holes and electrons may occur, leading to an increased dark current. However, when the condition of $E_{C\_L} \leq E_{C\_P1}$ is satisfied, electron transfer may be blocked, and a dark current reduction effect may be obtained.

Referring to FIG. 2A, the highest occupied molecular orbital (HOMO) energy level ($E_{V\_L}$) of the photoactive material may be equal to or less than the HOMO energy level ($E_{V\_P1}$) of the first perovskite compound. However, example embodiments are not limited thereto. Referring to FIG. 2B, the HOMO energy level ($E_{V\_L}$) of the photoactive material may be greater than the HOMO energy level ($E_{V\_P1}$) of the first perovskite compound. However, example embodiments are not limited thereto.

Figure 3A:
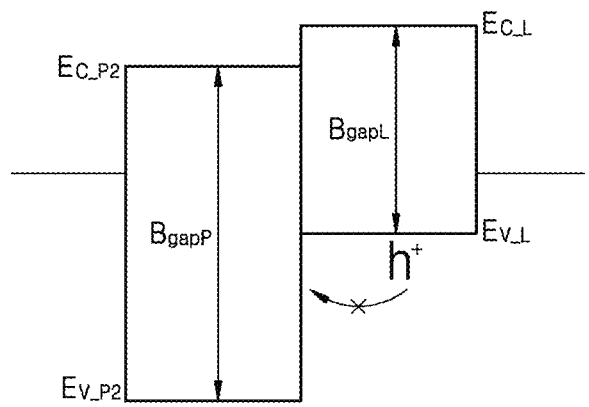
FIGS. 3A and 3B are schematic illustrations of energy levels of a photoactive material in a photoelectric conversion layer, and a second perovskite compound in a hole blocking layer.
Figure 3B:
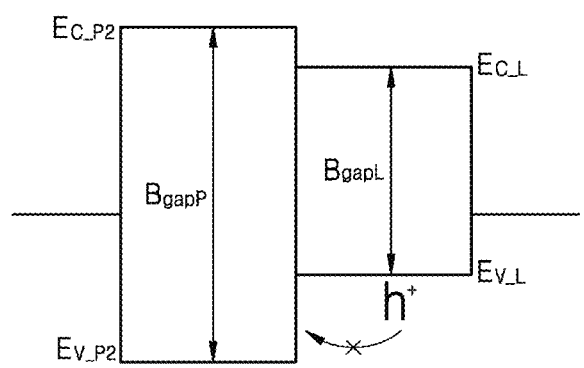

FIGS. 3A and 3B are schematic illustrations of energy levels of the photoactive material included in the photoelectric conversion layer 130, and the second perovskite compound included in the hole blocking layer 140.

Referring to FIGS. 3A and 3B, the HOMO energy level ($E_{V\_L}$) of the photoactive material may be greater than or equal to the HOMO energy level ($E_{V\_P2}$) of the second perovskite compound. When an external voltage is applied to a photoelectric conversion device, injection of holes and electrons may occur, leading to an increased dark current. However, when the condition of $E_{V\_L} \geq E_{V\_P2}$ is satisfied, hole transfer may be blocked, and a dark current reduction effect may be obtained.

Referring to FIG. 3A, the LUMO energy level ($E_{C\_L}$) of the photoactive material may be greater than or equal to the LUMO energy level ($E_{C\_P2}$) of the second perovskite compound. However, example embodiments are not limited thereto. Referring to FIG. 3B, the LUMO energy level ($E_{C\_L}$) of the photoactive material may be less than the LUMO energy level ($E_{C\_P2}$) of the second perovskite compound. However, example embodiments are not limited thereto.

The photoelectric conversion layer 130 may include a third perovskite compound represented by Formula 3

$[A^3][B^3][X^3_{(3-k)}Y^3_k]$.  Formula 3

In Formula 3, $A^3$ may include a monovalent organic cation, a monovalent inorganic cation, or any combination thereof, $B^3$ may include a divalent inorganic cation, $X^3$ and $Y^3$ may each independently include a monovalent anion, and k may be a real number satisfying $0 \leq k \leq 3$.

Figure 12A:
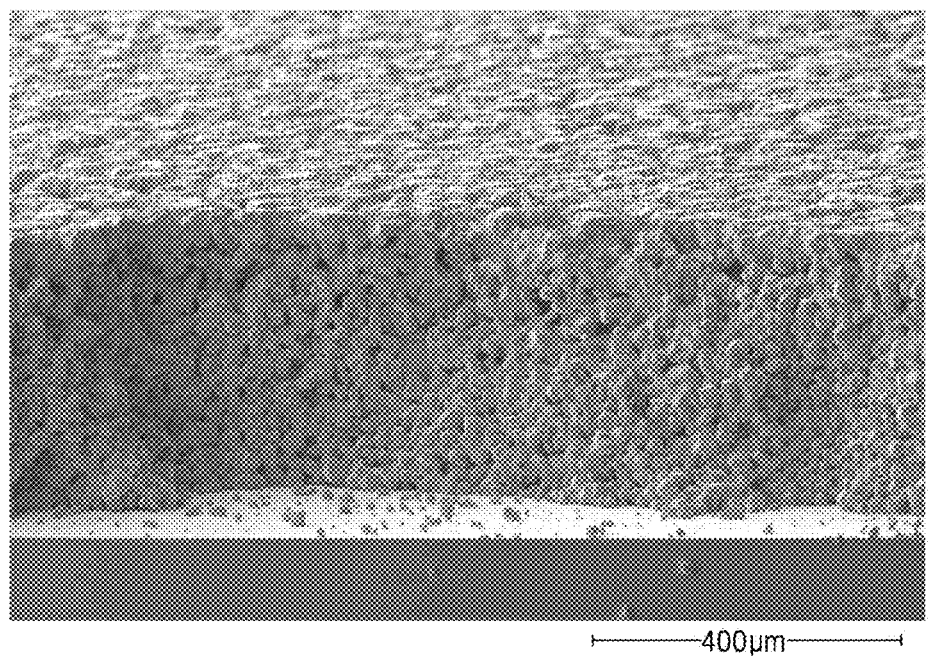
Figure 12B:
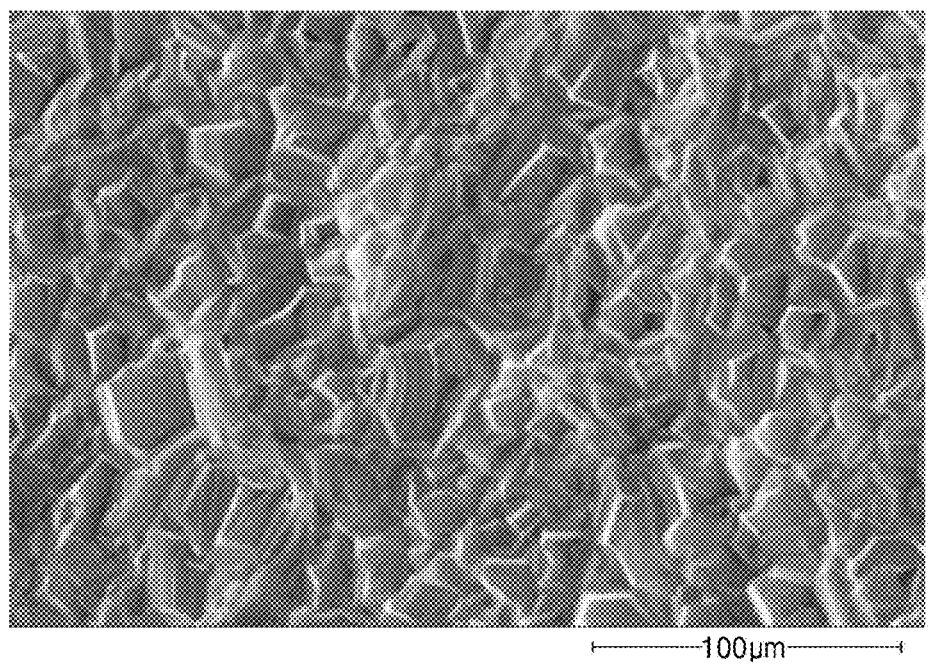
Figure 12C:
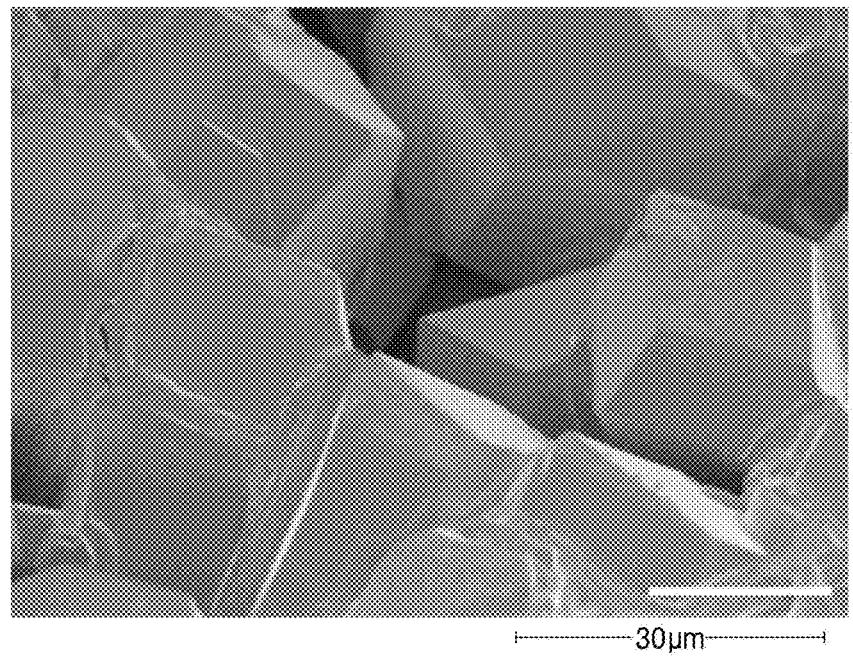
Figure 13:
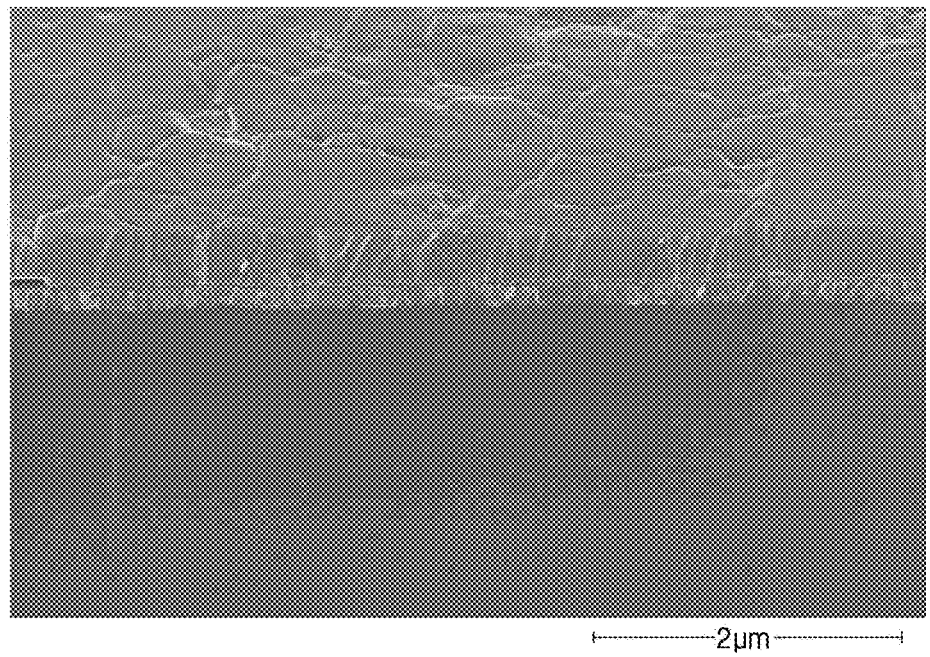
FIG. 13 is a SEM image of the hole blocking layer in the photoelectric conversion device of Example 1.

The third perovskite compound may be polycrystalline. The term "polycrystalline" used herein may refer to a form in which crystals are bound to one another. That is, the third perovskite compound may have a structure in which crystals are fused to each other. However, example embodiments are not limited thereto. The photoelectric conversion layer 130 may have a cross-sectional form as illustrated in FIG. 12A. However, example embodiments are not limited thereto. When the third perovskite compound is polycrystalline, effects of a dark current reduction and a photoelectric conversion efficiency increase may be obtained.

The longest axis of a crystal in the third perovskite compound may be about 1 μm to about 300 μm or about 10 μm to about 50 μm. However, example embodiments are not limited thereto. When the longest axis of a crystal in the third perovskite compound is within these ranges, a photoelectric conversion device with a sufficient dark current reduction effect may be obtained without reduction in photoelectric conversion efficiency.

In Formula 3, $A^3$ may be defined substantially the same as $A^1$ in Formula 1 as described above, $B^3$ may be defined substantially the same as $B^1$ in Formula 1 as described above, $X^3$ may be defined substantially the same as $X^1$ in Formula 1 as described above, $Y^3$ may be defined substantially the same as $Y^1$ in Formula 1 as described above, and k may be defined substantially the same as n in Formula 1 as described above.

In example embodiments, the third perovskite compound represented by Formula 3 may be $CH_3NH_3PbI_3$. However, example embodiments are not limited thereto.

The photoelectric conversion layer 130 may absorb light, for example, infrared rays, visible rays, or X-rays. In example embodiments, the photoelectric conversion layer 130 may absorb X-rays.

In a solar cell, an infrared imaging device and a visible light imaging device, a photoelectric conversion layer using a perovskite compound may be formed by deposition such as spin coating to have a thickness of about 1 μm or less. However, in an X-ray imaging device, it may be difficult to form a perovskite photoelectric conversion layer having a thickness of hundreds of micrometers over a wide region by deposition.

To address this drawback, solution process-based doctor blade coating may be used to form a polycrystalline perovskite photoelectric conversion layer having a thickness of hundreds of micrometers.

In example embodiments, the photoelectric conversion layer 130 may have a thickness of about 0.1 μm to about 1,500 μm. When the thickness of the photoelectric conversion layer 130 is within this range, photoelectric conversion efficiencies of infrared rays, visible rays, and even light having a short wavelength, such as X-rays, may be improved.

However, example embodiments are not limited thereto. In example embodiments, when the light is provided as visible rays or infrared rays, the photoelectric conversion layer 130 may have a thickness of about 0.1 μm to about 1 μm. However, example embodiments are not limited thereto.

However, example embodiments are not limited thereto. In example embodiments, when the light is provided as X-rays, the photoelectric conversion layer 130 may have a thickness of about 300 μm to about 1,500 μm. However, example embodiments are not limited thereto.

In example embodiments, the first conductive layer 110 and the second conductive layer 150 may be reflective, transmissive, or semi-transmissive depending on a use.

The first conductive layer 110 and the second conductive layer 150 may include a conductive material(s), for example, a metal, a metal oxide, an electrically conductive organic compound, or a combination thereof. For example, when the first conductive layer 110 is transmissive, a material for forming the first conductive layer 110 may be indium tin oxide (ITO), indium zinc oxide (IZO), tin oxide ($SnO_2$), zinc oxide (ZnO), or any combination thereof. However, example embodiments are not limited thereto. For example, when the first conductive layer 110 is semi-transmissive or reflective, the material for forming the first conductive layer 110 may be gold (Au), silver (Ag), chromium (Cr), nickel (Ni), or any combination thereof. However, example embodiments are not limited thereto. The above-listed materials for forming the first conductive layer 110 may be used as materials for forming the second conductive layer 150, and thus a detailed description of the second conductive layer 150 will be omitted here.

In example embodiments, when the light is provided as X-rays, the second conductive layer 150 may be reflective, transmissive, or semi-transmissive.

In example embodiments, when the light is provided as infrared rays or visible rays, the second conductive layer 150 may be transmissive. The second conductive layer 150 may be transmissive enough to allow light to enter the photoelectric conversion device through the second conductive layer 150.

The first conductive layer 110 and the second conductive layer 150 may have any thickness not specifically limited, for example, a thickness of about 10 nm to about 2,000 nm. However, example embodiments are not limited thereto.

Methods of forming the first conductive layer 110 and the second conductive layer 150 are not specifically limited, and may include a variety of methods, including coating, deposition, and the like.

Figure 4:
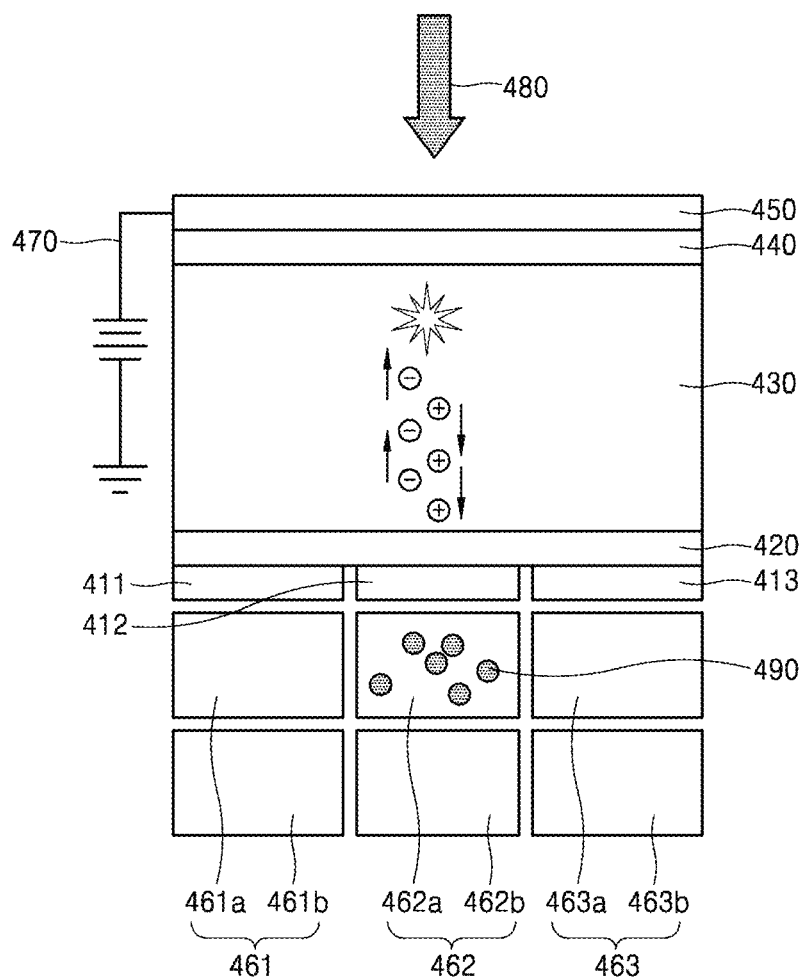
FIG. 4 is a schematic view for describing a method of operating a photoelectric conversion device according to an embodiment.

FIG. 4 is a schematic view for describing a method of operating a photoelectric conversion device according to an embodiment in a flat type imaging device. However, example embodiments are not limited thereto Referring to FIG. 4, a photoelectric conversion device according to an embodiment may include: first conductive layers 411, 412, and 413; a second conductive layer 450; and an electron blocking layer 420, a photoelectric conversion layer 430 and a hole blocking layer 440 which are between the first conductive layers 411, 412, and 413 and the second conductive layer 450.

The electron blocking layer 420 may be between the first conductive layers 411, 412, and 413 and the photoelectric conversion layer 430. The hole blocking layer 440 may be between the second conductive layer 450 and the photoelectric conversion layer 430.

The electron blocking layer 420 may include a first perovskite compound represented by Formula 1. The hole blocking layer 440 may include a second perovskite compound represented by Formula 2.

An electric field may be applied to the first conductive layers 411, 412, and 413, which serve as a negative electrode (negative bias), and the second conductive layer 450, which serves as a positive electrode (positive bias).

Unless stated otherwise, the above-described descriptions of the first conductive layer 110, the second conductive layer 150, the electron blocking layer 120, the photoelectric conversion layer 130, and the hole blocking layer 140 apply respectively to the first conductive layers 411, 412, and 413, the second conductive layer 450, the electron blocking layer 120, the photoelectric conversion layer 430, and the hole blocking layer 440, and thus detailed descriptions thereof will not be provided.

The second conductive layer 450 may be connected to a power source 470, so that an electric field may be applied to the second conductive layer 450. The opposite terminal of the power source 470 may be grounded. Accordingly, an electric field may be produced between the first conductive layers 411, 412, and 413 and the second conductive layer 450. When light 480 is incident onto the photoelectric conversion layer 430, the light 480 is converted into electrons and holes by the photoactive material of the photoelectric conversion layer 430. The electrons and holes are moved to the second conductive layer 450 and the first conductive layers 411, 412, and 413, respectively, by the electric field.

The first conductive layers 411, 412, and 413 may be connected to detectors 461, 462, and 463, respectively. The first conductive layers 411, 412, and 413 may be between the detectors 461, 462, and 463 and the electron blocking layer 420. That is, the detectors 461, 462, and 463 may be arranged on a bottom surface (i.e., a light exit surface) of the photoelectric conversion layer 430.

The detectors 461, 462, and 463 may detect charges 490 generated in the photoelectric conversion layer 430. The detectors 461, 462, and 463 may include storage capacitors 461a, 462a, and 463a and readout circuits 461b, 462b, and 463b, respectively. The readout circuits 461b, 462b, and 463b may read out the charges 490 collected by the storage capacitors 461a, 462a, and 463a, respectively.

The readout circuits 461b, 462b, and 463b may respectively convert the amounts of charges in the storage capacitors 461a, 462a, and 463a into digital signals. The digital signals may be converted into image signals by a signal processing unit (not shown).

The second conductive layer 450, the electron blocking layer 420, the photoelectric conversion layer 430, and the hole blocking layer 440 may be formed to cover the first conductive layers 411, 412, and 413.

FIGS. 5A to 5E are schematic cross-sectional views for describing a method of manufacturing a photoelectric conversion device according to an embodiment.

A method of manufacturing a photoelectric conversion device according to an embodiment may include: providing a first conductive layer; providing a first mixture including a $A^1$-containing precursor, a $B^1$-containing precursor, and a solvent to form an electron blocking layer including a first perovskite compound represented by Formula 1; forming a photoelectric conversion layer on the electron blocking layer; providing a second mixture including a $A^2$-containing precursor, a $B^2$-containing precursor, and a solvent to form a hole blocking layer including a second perovskite compound represented by Formula 2; and providing a second conductive layer on the hole blocking layer.

Figure 5A:
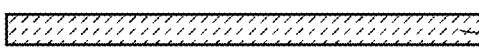
FIGS. 5A to 5E are schematic cross-sectional views for describing a method of manufacturing a photoelectric conversion device according to an embodiment.
Figure 5B:
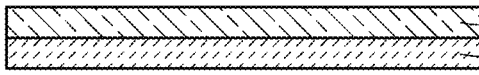
Figure 5C:
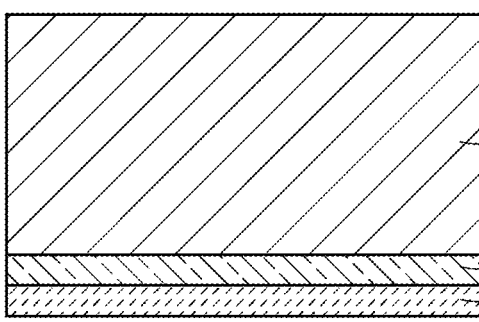
Figure 5D:
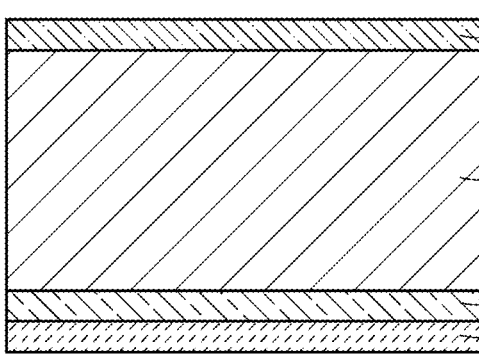
Figure 5E:
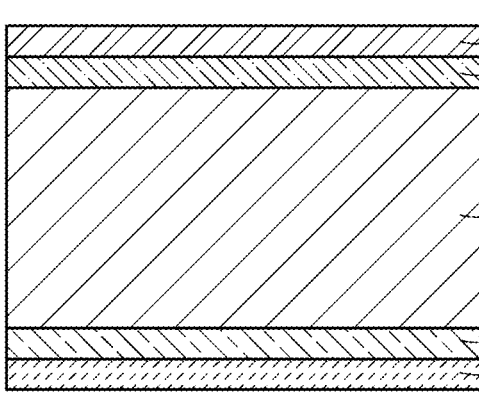

First, as illustrated in FIG. 5A, a first conductive layer 510 may be provided. The first conductive layer 510 may be the same as the first conductive layer 110 described above with reference to FIG. 1. The first conductive layer 510 may be provided using any of a variety of suitable methods.

Next, an electron blocking layer 520 may be provided on the first conductive layer 510. The electron blocking layer 520 may include a first perovskite compound represented by Formula 1. The first perovskite compound represented by Formula 1 may be obtained from a first mixture including an $A^1$-containing precursor, a $B^1$-containing precursor, and a solvent.

The electron blocking layer 520 may further include a polymer, together with the first perovskite compound. In this regard, the first mixture may further include the polymer or a precursor thereof.

The polymer may be any of a variety of suitable polymers. The polymer may be a polar polymer that may be soluble and miscible with the first perovskite compound in a solvent. For example, the polar polymer may be polyamic acid, polyimide, polyvinyl alcohol (PVA), polyacrylic acid, polyhydroxyethyl methacrylate (PHEMA), polymethyl methacrylate (PMMA), polyacrylate, or polyacrylonitrile (PAN). However, example embodiments are not limited thereto. The polymer may include a copolymer of the above-listed polymer materials.

For example, the first mixture may be spin-coated on the first conductive layer 510. When the first mixture is applied onto the first conductive layer 510 by spin coating, appropriate spin coating conditions may be chosen from, for example, a coating rate range of about 2,000 revolutions per minute (rpm) to about 4,000 rpm and a temperature range of about 80° C. to about 200° C., in consideration of the composition of the first mixture and the structure of the electron blocking layer 520.

The first mixture may be applied onto the first conductive layer 510 by using any of a variety of suitable methods.

The first mixture applied onto the first conductive layer 510 may be thermally treated to form the electron blocking layer 520. The thermal treatment temperature may be in a range of about 100° C. to about 300° C. When the thermal treatment temperature is less than 100° C., the electron blocking layer 520 may have reduced adhesion. When the thermal treatment temperature exceeds 300° C., the first perovskite compound may be damaged.

For example, appropriate thermal treatment conditions may be chosen from a temperature range of about 100° C. to about 300° C. for about 15 minutes to about 2 hours in consideration of the composition of the first mixture and the structure of the electron blocking layer 520.

The electron blocking layer 520 formed as described above may include the first perovskite compound. For example, the electron blocking layer 520 may include the first perovskite compound and the polar polymer, a composite of the first perovskite compound and the polar polymer, or two separate layers including the first perovskite compound and the polar polymer.

In the $A^1$-containing precursor and the $B^1$-containing precursor, $A^1$ and $B^1$ may be defined the same as described above in connection with Formula 1.

For example, the $A^1$-containing precursor may be a halide of $A^1$ (for example, $(A^1)(X^1)$), and the $B^1$-containing precursor may be a halide of $B^1$ (for example, $(B^1)(Y^1)_2$). In the $(A^1)(X^1)$ and $(B^1)(Y^1)_2$, $A^1$, $B^1$, $X^1$, and $Y^1$ may be defined the same as described above in connection with Formula 1.

The solvent may include a material in which the $A^1$-containing precursor and the $B^1$-containing precursor have high solubility. For example, the solvent may include dimethylformamide, dimethyl sulfoxide, γ-butyrolactone, N-methyl-2-pyrrolidone, or any combination thereof. However, example embodiments are not limited thereto.

Next, a photoelectric conversion layer 530 may be provided onto the electron blocking layer 520. The photoelectric conversion layer 530 may include a third perovskite compound represented by Formula 3. The third perovskite compound represented by Formula 3 may be obtained from a third mixture prepared by adding a non-solvent to a mixture including an $A^3$-containing precursor, a $B^3$-containing precursor, and a solvent and then stirring at a temperature of about 70° C. to about 120° C.

The solvent may include a material in which the $A^3$-containing precursor and the $B^3$-containing precursor have high solubility. For example, the solvent may include dimethylformamide, dimethyl sulfoxide, γ-butyrolactone, or any combination thereof. However, example embodiments are not limited thereto.

The non-solvent may include a material in which the $A^3$-containing precursor and the $B^3$-containing precursor have low solubility. For example, the non-solvent may include α-terpineol, hexyl carbitol, butyl carbitol acetate, hexyl cellosolve, butyl cellosolve acetate, or any combination thereof. However, example embodiments are not limited thereto.

For example, the third mixture may be coated on the electron blocking layer 520 by doctor blade coating or bar coating. While not wanting to be bound by theory, it is understood that the third mixture may have increased viscosity, for example, due to the addition of the non-solvent, and thus may be applied by doctor blade coating or bar coating. When the third mixture is applied onto the electron blocking layer 520 by doctor blade coating, appropriate doctor blade coating conditions may be chosen within a temperature range of about 80° C. to about 200° C. in consideration of the composition of the third mixture and the structure of the photoelectric conversion layer 530.

The third mixture may be applied onto the electron blocking layer 520 by using any of a variety of suitable methods.

The third mixture applied onto the electron blocking layer 520 may be thermally treated to form the photoelectric conversion layer 530.

For example, appropriate thermal treatment conditions may be chosen from a temperature range of about 100° C. to about 200° C. for about 15 minutes to about 2 hours in consideration of the composition of the third mixture and the structure of the photoelectric conversion layer 530.

Optionally, after the third mixture is applied onto the electron blocking layer 520 to form a preliminary photoelectric conversion layer including the third perovskite compound represented by Formula 3, the preliminary photoelectric conversion layer may be pressed at a high temperature (for example, in a temperature range of about 100° C. to about 200° C.) under high pressure (for example, in a pressure range of about 5 atmosphere (atm) to about 10 atm) to obtain the photoelectric conversion layer. Optionally, during this process the $A^3$-containing precursor may be further supplied in a gas phase. In this case, the third perovskite compound represented by Formula 3 may be polycrystalline.

Next, a hole blocking layer 540 may be provided on the photoelectric conversion layer 530. The hole blocking layer 540 may include a second perovskite compound represented by Formula 2. The second perovskite compound represented by Formula 2 may be obtained from a second mixture including an $A^2$-containing precursor, a $B^2$-containing precursor, and a solvent.

The hole blocking layer 540 may further include a polymer, together with the second perovskite compound. In this regard, the second mixture may further include the polymer or a precursor thereof.

The polymer may be any of a variety of suitable polymers. The polymer may be a polar polymer that may be soluble and miscible with the second perovskite compound in a solvent. For example, the polar polymer may be polyamic acid, polyimide, polyvinyl alcohol (PVA), polyacrylic acid, polyhydroxyethyl methacrylate (PHEMA), polymethyl methacrylate (PMMA), polyacrylate, or polyacrylonitrile (PAN). However, example embodiments are not limited thereto. The polymer may include a copolymer of the above-listed polymer materials.

For example, the second mixture may be spin-coated on the photoelectric conversion layer 530. When the second mixture is applied onto the photoelectric conversion layer 530 by spin coating, appropriate spin coating conditions may be chosen from, for example, a coating rate range of about 2,000 rpm to about 4,000 rpm and a temperature range of about 80° C. to about 200° C., in consideration of the composition of the second mixture and the structure of the hole blocking layer 540.

The second mixture may be applied onto the photoelectric conversion layer 530 by using any of a variety of suitable methods.

The second mixture applied onto the photoelectric conversion layer 530 may be thermally treated to form the hole blocking layer 540. The thermal treatment temperature may be in a range of about 100° C. to about 300° C. When the thermal treatment temperature is less than 100° C., the hole blocking layer 540 may have reduced adhesion. When the thermal treatment temperature exceeds 300° C., the second perovskite compound may be damaged.

For example, appropriate thermal treatment conditions may be chosen from a temperature range of about 100° C.

to about 300° C. for about 15 minutes to about 2 hours in consideration of the composition of the second mixture and the structure of the hole blocking layer 540.

The hole blocking layer 540 formed as described above may include the second perovskite compound. For example, the hole blocking layer 540 may include the second perovskite compound and the polar polymer, a composite of the second perovskite compound and the polar polymer, or two separate layers including the second perovskite compound and the polar polymer.

In the $A^2$-containing precursor and the $B^2$-containing precursor, $A^2$ and $B^2$ may be defined the same as described above in connection with Formula 2.

For example, the $A^2$-containing precursor may be a halide of $A^2$ (for example, $(A^2)(X^2)$), and the $B^2$-containing precursor may be a halide of $B^2$ (for example, $(B^2)(Y^2)_2$). In the $(A^2)(X^2)$ and $(B^2)(Y^2)_2$, $A^2$, $B^2$, $X^2$, and $Y^2$ may be defined the same as described above in connection with Formula 2.

The solvent may include a material in which the $A^2$-containing precursor and the $B^2$-containing precursor have high solubility. For example, the solvent may include dimethylformamide, dimethyl sulfoxide, γ-butyrolactone, N-methyl-2-pyrrolidone, or any combination thereof. However, example embodiments are not limited thereto.

Next, a second conductive layer 550 may be provided on the hole blocking layer 540. The second conductive layer 550 may be the same as the second conductive layer 150 described above with reference to FIG. 1. The second conductive layer 550 may be provided using any of a variety of suitable methods.

A photoelectric conversion device according to any of the above-described example embodiments may be included in an imaging device. The imaging device may be a stationary or mobile imaging device.

The imaging device may include a light irradiation unit, a photodetector unit, and a control unit.

The light irradiation unit may include a light source which generates light, and a collimator which guides a path of the generated light to control a light irradiation region.

The light source may include, for example, an X-ray tube. The X-ray tube may be implemented as a bipolar vacuum tube consisting of a cathode and an anode. A voltage applied between the cathode and the anode of the X-ray tube is referred to as a tube voltage, wherein the maximum tube voltage is expressed in peak kilovoltage (kVp). An increased tube voltage leads to an increased rate of thermoelectrons, which consequently leads to increased X-ray energy (photon energy) from collision of thermoelectrons against a target material. A current which flows in the X-ray tube is referred to as a tube current, and an average tube current is expressed in mA. An increased tube current leads to an increased number of thermoelectrons emitted from the filament, which consequently leads to an increased X-ray dose (number of X-ray photons) from collision of thermoelectrons against a target material. Thus, X-ray energy may be controlled by the tube voltage, and the X-ray intensity or dose may be controlled by the tube current and an X-ray exposure time.

The photodetector unit may detect light which has passed through an object after emission from the light irradiation unit. For example, the photodetector unit may include a flat photodetector. The photodetector unit may include the photoelectric conversion device 100 described above with reference to FIG. 1.

The control unit may include a voltage generating unit, a signal processing unit, and an operating unit, and may control the overall operation of the imaging device.

The voltage generating unit may generate a high voltage for light emission and apply the voltage to the light source of the light irradiation unit.

The signal processing unit may generate an image by processing information detected by the photodetector unit or may generate a control signal based on information input to the operating unit to control the components of the imaging device.

The operating unit, which may provide an interface for operating the imaging device, may receive various types of information, regarding operation commands of the image device or imaging, from a user.

The imaging device may further include an output unit. The output unit may display imaging-related information such as light irradiation or may display an image generated by the signal processing unit.

Example embodiments will now be described in detail with reference to the following examples. However, these examples are only for illustrative purposes and are not intended to limit the scope of example embodiments. In the following preparation examples, the expression that "mixture 'B' was used, instead of mixture 'A'" means that the amounts of mixtures 'B' and 'A' were the same in equivalent amounts.

EXAMPLES

Preparation Example 1. Preparation of Electron Blocking Material (Mixture B)

(1) Preparation of Mixture A

After ρ-phenylenediamine and biphenyl-tetracarboxylic acid dianhydride were mixed in a molar ratio of about 1:0.975 in a reactor, N-methyl-2-pyrrolidone (NMP) was added to the mixture and stirred under nitrogen atmosphere at room temperature for about 5 hours. Then, the resulting mixture was reacted in an airtight reactor at about 40° C. for about 12 hours to prepare mixture A.

(2) Preparation of Mixture B 1.59 grams (g) of $CH_3NH_3I$, 4.61 g of $PbI_2$, and 2.4 g of dimethylformamide were added to 4.8 g of the mixture A and stirred overnight at room temperature to prepare mixture B.

Preparation Example 2. Preparation of Hole Blocking Material (Mixture C, Mixture D, or Mixture E)

2-1. Preparation of Mixture C $CH_3NH_3Br$, $PbBr_2$, dimethyl formamide, and dimethyl sulfoxide were mixed in a molar ratio of about 1:1:6.7:2 in a reactor, and stirred at room temperature for about 1 hour to prepare mixture C.

2-2. Preparation of Mixture D (1) Preparation of Mixture A

ρ-phenylenediamine and biphenyl-tetracarboxylic acid dianhydride were mixed in a molar ratio of about 1:0.975 in a reactor, NMP was added to the mixture and stirred under nitrogen atmosphere at room temperature for about 5 hours. Then, the resulting mixture was reacted in an airtight reactor at about 40° C. for about 12 hours to prepare mixture A.

(2) Preparation of Mixture D 2.34 g of $CH_3NH_3Br$, 7.67 g of $PbBr_2$, and 4.8 g of dimethylformamide were added to 9.6 g of the mixture A and stirred overnight at room temperature to prepare mixture D.

2-3. Preparation of Mixture E

Mixture E was prepared in the same manner as above in Section 2-2 of Preparation Example 2, except that 1.17 g of $CH_3NH_3Br$ and 3.835 g of $PbBr_2$ were used instead of 2.34 g of $CH_3NH_3Br$ and 7.67 g of $PbBr_2$.

Preparation Example 3. Preparation of Photoelectric Conversion Material (Mixture F or Mixture G)

3-1. Preparation of Mixture F $CH_3NH_3I$, $PbI_2$, dimethyl formamide, and dimethyl sulfoxide were added to a reactor in a molar ratio of about 1:1:6.7:2, and stirred at room temperature for about 1 hour to prepare mixture F.

3-2. Preparation of Mixture G

After 18.44 g of $PbI_2$ and 7.75 g of γ-butyrolactone were mixed in a reactor and stirred at about 80° C. for about 1 hour, 6.36 g of $CH_3NH_3I$ was further added to the mixture and stirred at about 90° C. to about 100° C. for about 4 hours. Then, 4 g of α-terpineol was further added to the mixture and stirred at about 90° C. to about 100° C. for about 4 hours to prepare mixture G.

Example 1. Manufacture of Photoelectric Conversion Device

A first conductive layer having a thickness of about 200 nm was formed by sputtering amorphous indium tin oxide (ITO) onto a glass substrate.

The mixture B was spin-coated on the first conductive layer at about 2,000 revolutions per minute (rpm) for about 30 seconds, and dried at about 120° C. for about 30 minutes to form an electron blocking layer having a thickness of about 3 micrometers (μm).

The mixture G was coated on the electron blocking layer using a doctor blade, thermally treated at about 120° C. for about 1 hour, and then thermally treated in a vacuum oven at about 90° C. for about 1 hour, thereby forming a preliminary photoelectric conversion layer. The preliminary photoelectric conversion layer was pressed under 5 atmosphere (atm) at about 120° C. to form a photoelectric conversion layer having a thickness of about 830 μm.

The mixture C was spin-coated on the photoelectric conversion layer at about 2,000 rpm for about 30 seconds, while about 2 milliliters (mL) of diethyl ether was dropwise added each second for about 20 seconds, starting from about 10 seconds after the start of the spin coating, followed by heat treatment at about 100° C. for about 10 minutes to form a hole blocking layer having a thickness of about 1 μm.

A glass substrate including amorphous ITO sputtered thereonto to a thickness of about 200 nanometers (nm) was combined onto the hole blocking layer, thereby manufacturing a photoelectric conversion device.

Figure 6A:
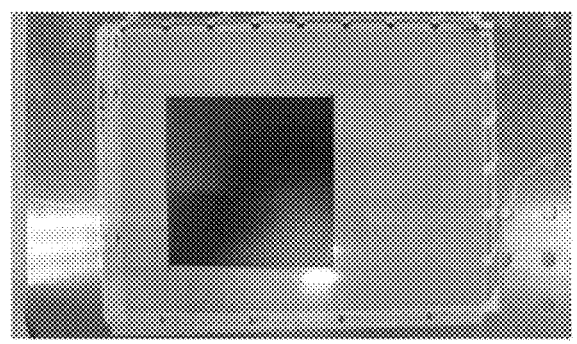
FIGS. 6A to 6C are surface images of an electron blocking layer, a photoelectric conversion layer, and a hole blocking layer in a photoelectric conversion device of Example 1, respectively.
Figure 6B:
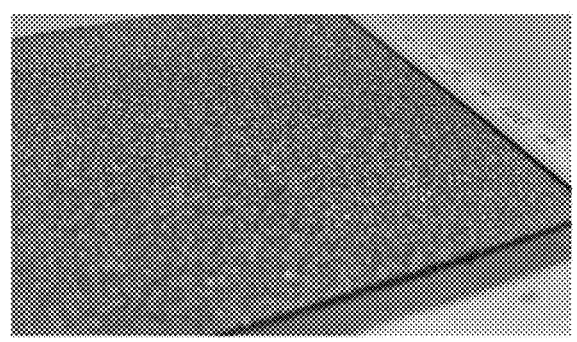
Figure 6C:
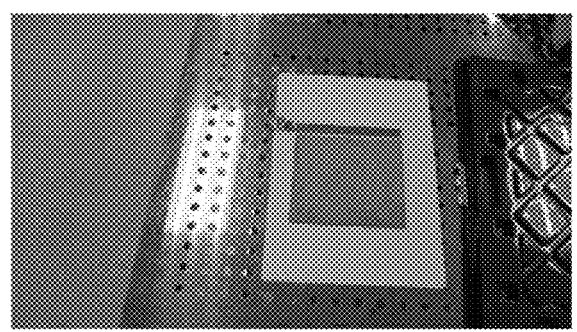

Surface images of the electron blocking layer, the photoelectric conversion layer, and the hole blocking layer in Example 1 are shown in FIGS. 6A to 6C, respectively. Scanning electron microscope (SEM) images of the electron blocking layer, the photoelectric conversion layer, and the hole blocking layer in the photoelectric conversion device of Example 1 are shown in FIG. 11, FIGS. 12A to 12C, and FIG. 13.

Example 2. Manufacture of Photoelectric Conversion Device

A photoelectric conversion device was manufactured in the same manner as in Example 1, except that the mixture D, instead of the mixture C, was used to form the hole blocking layer.

Figure 14A:
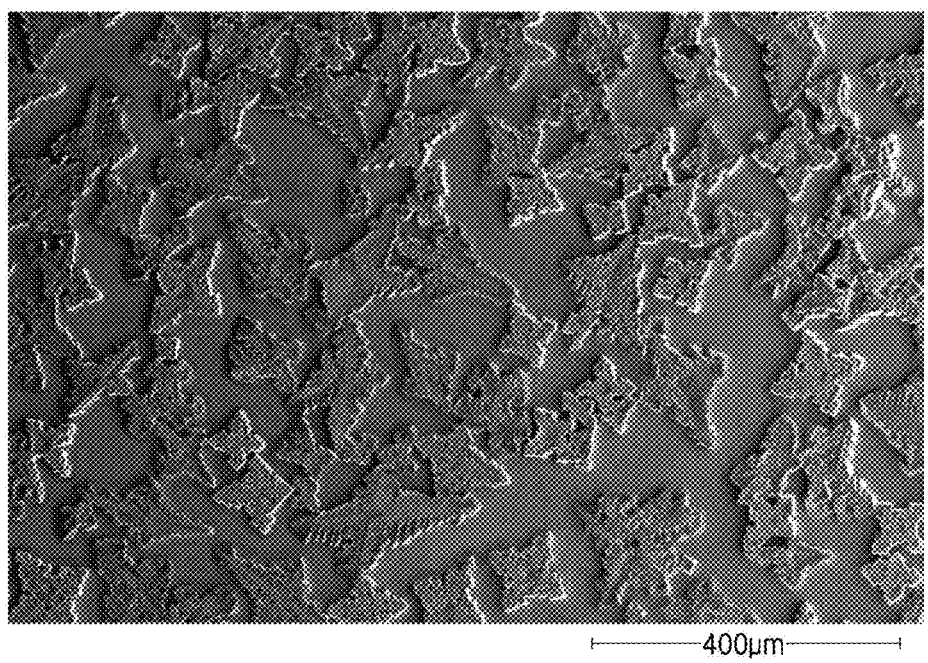
Figure 14B:
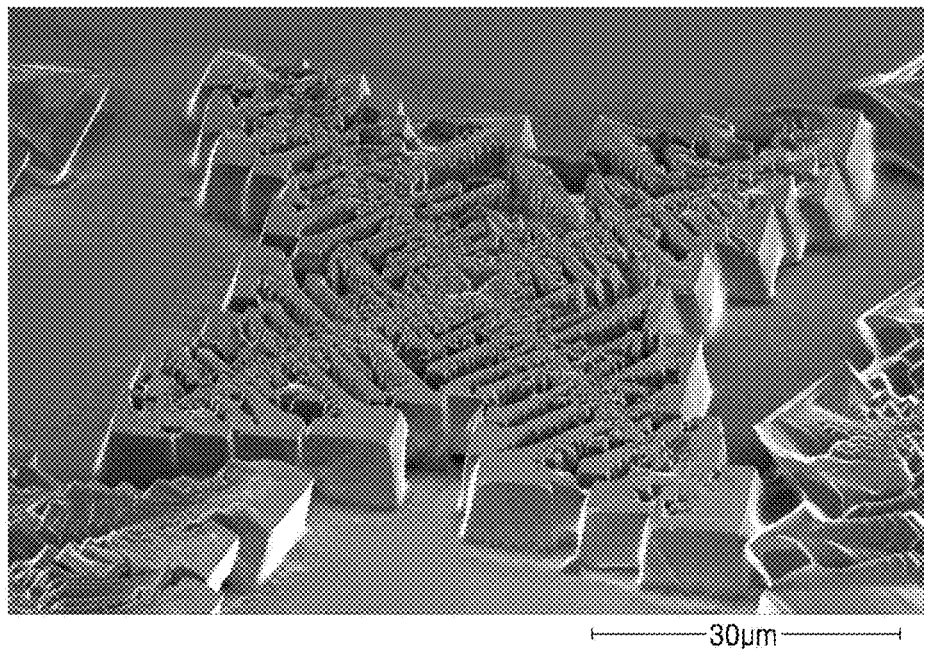

SEM images of the hole blocking layer in the photoelectric conversion device of Example 2 are shown in FIGS. 14A and 14B. Referring to FIGS. 14A and 14B, a square star pattern was found on the surface of the hole blocking layer.

Example 3. Manufacture of Photoelectric Conversion Device

A photoelectric conversion device was manufactured in the same manner as in Example 1, except that mixture E, instead of mixture C, was used to form the hole blocking layer.

Comparative Example 1. Manufacture of Photoelectric Conversion Device

A photoelectric conversion device was manufactured in the same manner as in Example 1, except that the hole blocking layer and the electron blocking layer were not included.

Comparative Example 2. Manufacture of Photoelectric Conversion Device

A photoelectric conversion device was manufactured in the same manner as in Example 1, except that $TiO_2$ was used, instead of the mixture C, to form the hole blocking layer, and spiro-OMeTAD(2,2',7,7'-tetrakis(N,N-dimethoxyphenyl-amine)9,9'-spiro-bifluorene), instead of the mixture B, was used to form the electron blocking layer.

Comparative Example 3. Manufacture of Photoelectric Conversion Device

A photoelectric conversion device was manufactured in the same manner as in Example 1, except that the mixture A, instead of the mixture B, was used to form the electron blocking layer.

Comparative Example 4. Manufacture of Photoelectric Conversion Device

A photoelectric conversion device was manufactured in the same manner as in Example 1, except that the mixture A, instead of the mixture B, was used to form the electron blocking layer, and the drying was performed at about 200° C., instead of about 120° C.

Comparative Example 5. Manufacture of Photoelectric Conversion Device

A photoelectric conversion device was manufactured in the same manner as in Example 1, except that the hole blocking layer and the electron blocking layer were not included, and a photoelectric conversion layer having a thickness of about 0.5 μm was formed by coating the mixture F by spin coating, instead of coating the mixture G by doctor blade coating.

Evaluation Example 1

Current densities of the photoelectric conversion devices of Examples 1 to 3 and Comparative Examples 1 and 2 were measured at different voltages. The measurement of the current densities was repeated under the same conditions with and without external light irradiation ("Photo" and "Dark" conditions, respectively). The experimental results are shown in FIG. 7.

Figure 7:
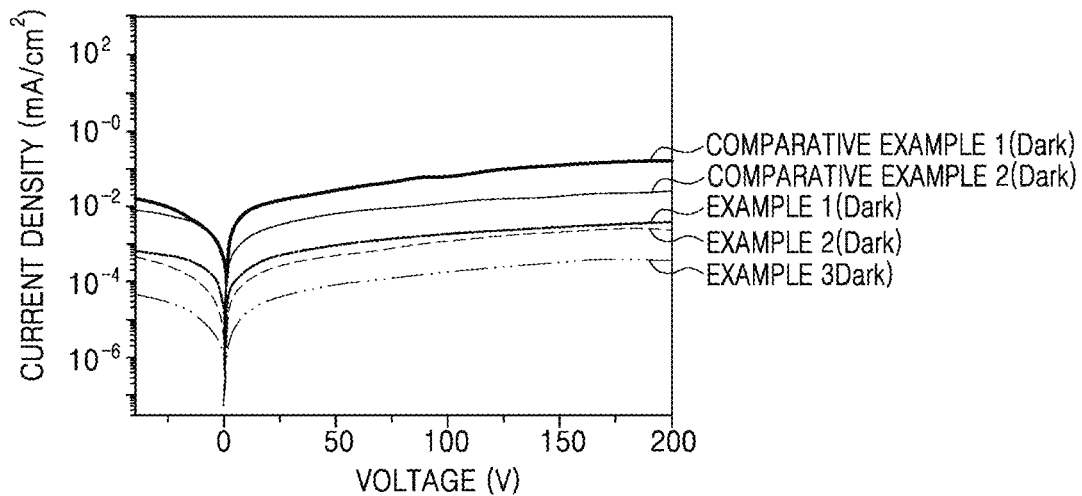
FIG. 7 is a graph of current density (milliamperes per square centimeter ($mA/cm^2$)) versus voltage, illustrating the experimental results of Evaluation Example 1 for photoelectric conversion devices of Examples 1 to 3 and Comparative Examples 1 and 2.

Referring to FIG. 7, without external light irradiation ("Dark" condition), a current density of the photoelectric conversion devices of Examples 1 to 3 was found to be less than a current density of with the photoelectric conversion devices of Comparative Examples 1 and 2.

Evaluation Example 2

Current densities of the photoelectric conversion devices of Comparative Examples 3 and 4 were measured at different voltages. The measurement of the current densities was repeated under the same conditions with and without external light irradiation ("Photo" and "Dark" conditions, respectively). The experimental results are shown in FIG. 8.

Figure 8:
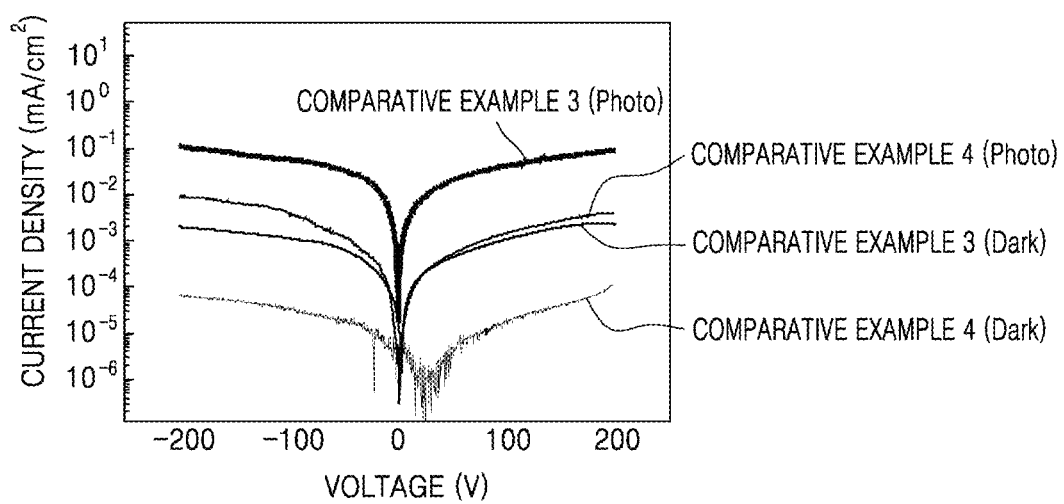
FIG. 8 is a graph of current density ($mA/cm^2$) versus voltage, illustrating the experimental results of Evaluation Example 2 for photoelectric conversion devices of Comparative Examples 3 and 4.

Referring to FIG. 8, the photoelectric conversion devices of Comparative Examples 3 and 4 were found to be significantly reduced both in photocurrent and dark current, for example, due to the use of polyimide only in the electron blocking layer. In particular, in the photoelectric conversion device of Comparative Example 4, a remarkable reduction in photocurrent as well as in dark current was found, for example, due to the imidization. While not wanting to be bound by theory, it is understood that the reduction in photocurrent as well as in dark current may be attributed to the fact that when the mixture A, instead of the mixture B, was used to form the electron blocking layer, the produced polyimide may have served as a barrier of photocharge transfer to an electrode.

Evaluation Example 3

Currents of the photoelectric conversion device of Example 2 were measured at different voltages. The photoelectric conversion device was irradiated by X-rays, wherein a distance between an X-ray source and the photoelectric conversion device was about 30 centimeters (cm), an X-ray tube voltage was about 100 kVp, an X-ray tube current was about 20 mA, and an X-ray irradiation time was about 0.2 seconds. The experimental results are shown in FIG. 9.

Figure 9:
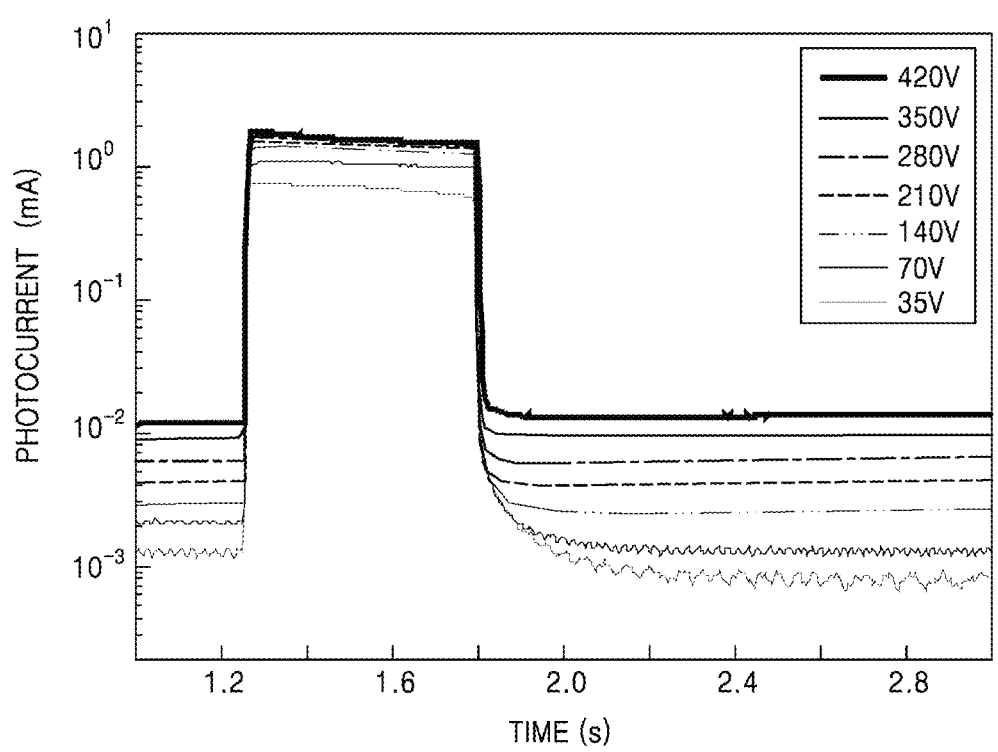
FIG. 9 is a graph of photoelectric current (milliamperes (mA)) versus time (seconds (s)), illustrating the experimental results of Evaluation Example 3 for the photoelectric conversion device of Example 2.

Referring to FIG. 9, the photoelectric conversion device of Example 2 was found to have a high sensitivity to X-rays.

Evaluation Example 4

Figure 10A:
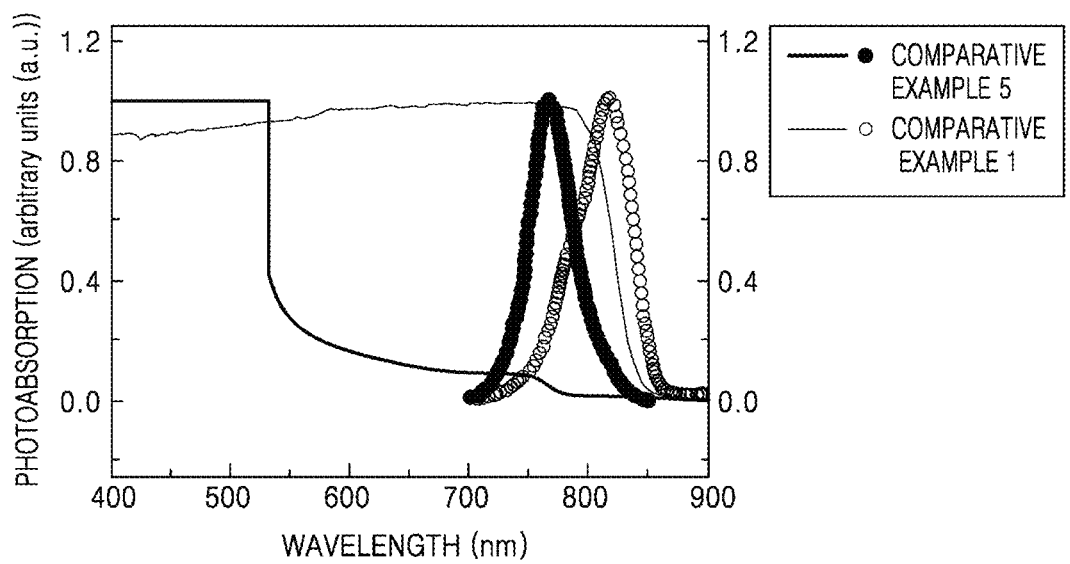
FIG. 10A is a graph of photoabsorption (arbitrary units (a.u.)) versus wavelength (nanometers (nm)) of photoelectric conversion devices of Comparative Examples 1 and 5, as a result of Evaluation Example 4.
Figure 10B:
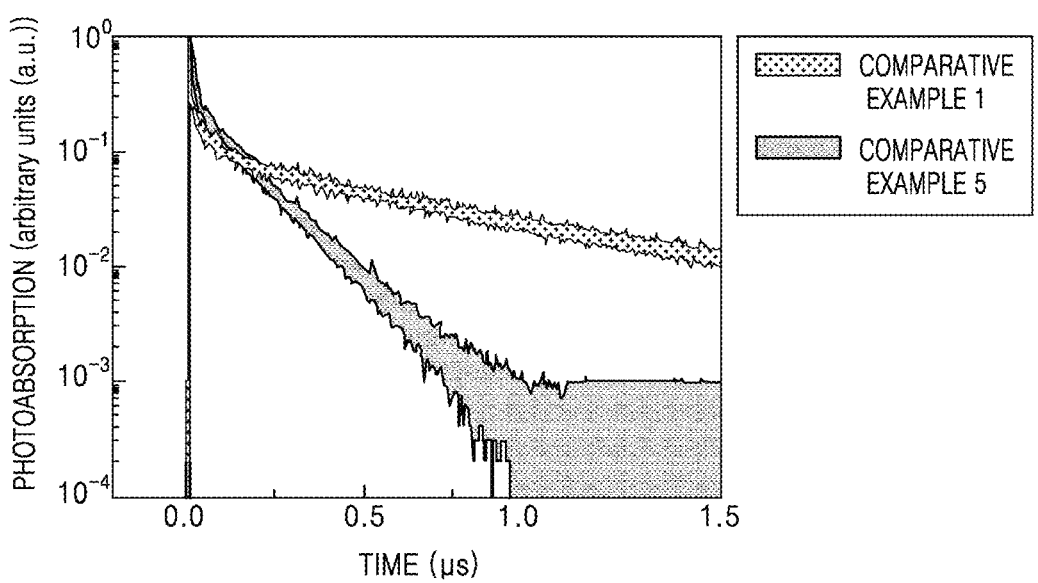
FIG. 10B is a graph of photoluminescence (a.u.) versus time (microseconds (μs)) of photoelectric conversion devices of Comparative Examples 1 and 5, as a result of Evaluation Example 4.
Figure 11:
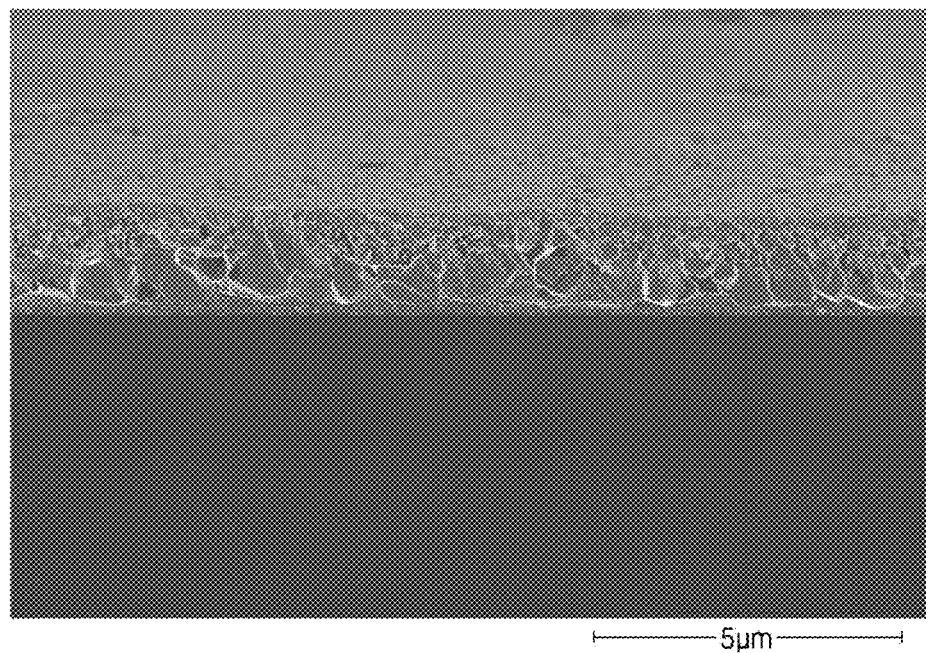
FIG. 11 is a scanning electron microscope (SEM) image of the electron blocking layer in the photoelectric conversion device of Example 1.

Photoabsorption versus wavelength and photoluminescence versus time of the photoelectric conversion layers in the photoelectric conversion devices of Comparative Examples 1 and 5 were evaluated. The results are shown in FIGS. 10A and 10B, respectively. A light source having a wavelength of 505 nm was used as an excitation source, and the carrier lifetime T was determined using time-resolved photoluminescence (TRPL).

Referring to FIG. 10A, the photoelectric conversion layer of Comparative Example 5 was found to exhibit an absorption edge at about 760 nm, while the photoelectric conversion layer of Comparative Example 1 exhibited an expanded absorption band at about 840 nm.

Referring to FIG. 10B, the photoelectric conversion layer of Comparative Example 5 had a carrier lifetime ($\tau$) of about 128 nanoseconds (ns), while the photoelectric conversion layer of Comparative Example 1 had a carrier lifetime ($\tau$) of about 1,052 ns.

Also, the photoelectric conversion device of Comparative Example 1 exhibited a greater photoluminescent intensity by about 100 times than the photoelectric conversion device of Comparative Example 5.

This result supports that the photoelectric conversion layer having a thickness of about hundreds of micrometers or greater formed by doctor blade-coating the mixture G may exhibit improved photoelectric conversion efficiency than the photoelectric conversion layer having a thickness of several micrometers formed by spin-coating the mixture F.

As described above, according to example embodiments, a photoelectric conversion device including a perovskite compound may have improved photoelectric conversion efficiency and a reduced dark current, and a high-definition imaging device may be provided by using the photoelectric conversion device.

It should be understood that example embodiments described herein should be considered in a descriptive sense only and not for purposes of limitation. Descriptions of features or aspects within each embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A photoelectric conversion device comprising:
a first conductive layer;
a second conductive layer;
a photoelectric conversion layer between the first conductive layer and the second conductive layer;
an electron blocking layer between the photoelectric conversion layer and the first conductive layer; and
a hole blocking layer between the photoelectric conversion layer and the second conductive layer,
wherein the electron blocking layer comprises a first perovskite compound represented by Formula 1, and the hole blocking layer comprises a second perovskite compound represented by Formula 2, $$[A^1][B^1][X^1_{(3-n)}Y^1_n] \qquad \text{Formula 1}$$

wherein, in Formula 1,
$A^1$ comprises a monovalent organic cation, a monovalent inorganic cation, or a combination thereof,
$B^1$ comprises a divalent inorganic cation,
$X^1$ and $Y^1$ each independently comprises a monovalent anion, and
n is a real number satisfying $0 \leq n \leq 3$, and $$[A^2][B^2][X^2_{(3-n)}Y^2_m] \qquad \text{Formula 2}$$

wherein, in Formula 2,
$A^2$ comprises a monovalent organic cation, a monovalent inorganic cation, or a combination thereof,
$B^2$ comprises a divalent inorganic cation,
$X^2$ and $Y^2$ each independently comprises a monovalent anion, and
m is a real number satisfying $0 \leq m \leq 3$,
wherein the electron blocking layer further comprises a polar polymer, the hole blocking layer further comprises a polar polymer, or a combination thereof,
wherein the polar polymer in the electron blocking layer forms a complex with the first perovskite compound, the polar polymer in the hole blocking layer forms a complex with the second perovskite compound, or a combination thereof, and wherein the polar polymer comprises polyamic acid, polyimide, polyvinyl alcohol, polyacrylic acid, polyhydroxyethyl methacrylate, polymethyl methacrylate, polyacrylate, polyacrylonitrile, or a combination thereof.

2. The photoelectric conversion device of claim 1, wherein $A^1$ and $A^2$ are each independently $(R_2R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienium, $Li^+$, $Na^+$, $K^+$, $Rb^+$, $Cs^+$, $Fr^+$, or a combination thereof; and $R_1$ to $R_5$, and at least one substituent of the substituted cycloheptatrienium are each independently hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, a $C_1$-$C_{20}$ alkoxy group, or —$N(Q_1)(Q_2)$, and $Q_1$ and $Q_2$ are each independently be hydrogen, deuterium, a $C_1$-$C_{20}$ alkyl group, a $C_2$-$C_{10}$ alkenyl group, a $C_2$-$C_{10}$ alkynyl group, or a $C_1$-$C_{20}$ alkoxy group.

3. The photoelectric conversion device of claim 1, wherein $A^1$ and $A^2$ are each independently $(CH_3NH_3)^+$, $((CH_3CH_2CH_2CH_2)NH_3)^+$, $(NH_2CHNH_2)^+$, $K^+$, $Rb^+$, $Cs^+$, or a combination thereof.

4. The photoelectric conversion device of claim 1, wherein $B^1$ and $B^2$ are each independently $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, or a combination thereof.

5. The photoelectric conversion device of claim 1, wherein $B^1$ and $B^2$ are $Pb^{2+}$.

6. The photoelectric conversion device of claim 1, wherein $X^1$, $Y^1$, $X^2$, and $Y^2$ each independently are $Cl^-$, $Br^-$, or $I^-$.

7. The photoelectric conversion device of claim 1, wherein the first perovskite compound represented by Formula 1 and the second perovskite compound represented by Formula 2 each independently are $CH_3NH_3PbI_3$, $CH_3NH_3PbBr_3$, $CH_3NH_3PbCl_3$, $CH_3NH_3PbBr_{(3-o)}I_o$, $CH_3NH_3PbCl_{(3-o)}Br_o$, $CH_3NH_3PbCl_{(3-o)}I_o$, $CsPbI_3$, $CsPbBr_3$, $CH_3CH_2CH_2CH_2NH_3PbBr_3$, $NH_2CHNH_2PbBr_3$, $NH_2CHNH_2PbBr_{(3-o)}I_o$, $[CH_3NH_3]_{(1-x)}[NH_2CHNH_2]_xPbBr_3$, or $[CH_3NH_3]_{(1-x)}[NH_2CHNH_2]_xPbBr_{(3-o)}I_o$, wherein o is a real number greater than 0 and less than 3, and x is a real number greater than 0 and less than 1.

8. The A-photoelectric conversion device of claim 1, wherein an amount of the polar polymer in the electron blocking layer is about 5 parts to about 60 parts by weight, based on 100 parts by weight of the first perovskite compound represented by Formula 1, and an amount of the polar polymer in the hole blocking layer is about 5 parts to about 60 parts by weight, based on 100 parts by weight of the second perovskite compound represented by Formula 2.

9. The photoelectric conversion device of claim 1, wherein the electron blocking layer comprises $CH_3NH_3PbI_3$ and polyimide, and the hole blocking layer comprises $CH_3NH_3PbBr_3$ and polyimide.

10. The photoelectric conversion device of claim 1, wherein the hole blocking layer has a square star pattern, a butterfly pattern, a starfish pattern, a sawtooth pattern, or a clover pattern on a surface thereof.

11. The photoelectric conversion device of claim 1, wherein the photoelectric conversion layer comprises a photoactive material, the lowest unoccupied molecular orbital energy level of the photoactive material is equal to or less than the lowest unoccupied molecular orbital energy level of the first perovskite compound, and the highest occupied molecular orbital energy level of the photoactive material is greater than or equal to the highest occupied molecular orbital energy level of the second perovskite compound.

12. The photoelectric conversion device of claim 1, wherein the photoelectric conversion layer comprises a third perovskite compound represented by Formula 3, and the third perovskite compound is polycrystalline:

$$[A^3][B^3][X^3_{(3-k)}Y^3_k] \quad \text{Formula 3}$$

wherein, in Formula 3, $A^3$ comprises a monovalent organic cation, a monovalent inorganic cation, or a combination thereof, $B^3$ comprises a divalent inorganic cation, $X^3$ and $Y^3$ each independently comprises a monovalent anion, and k is a real number satisfying $0 \leq k \leq 3$.

13. The photoelectric conversion device of claim 12, wherein crystals of the third perovskite compound represented by Formula 3 are fused to each other.

14. The photoelectric conversion device of claim 12, wherein a longest axis of the third perovskite compound represented by Formula 3 has a length of about 1 micrometer to about 300 micrometers.

15. The photoelectric conversion device of claim 12, wherein the third perovskite compound represented by Formula 3 is $CH_3NH_3PbI_3$.

16. The photoelectric conversion device of claim 1, wherein the photoelectric conversion layer absorbs infrared rays, visible rays, or X-rays.

17. The photoelectric conversion device of claim 1, wherein the photoelectric conversion layer has a thickness of about 0.1 micrometers to about 1,500 micrometers.

18. The photoelectric conversion device of claim 1, wherein the second conductive layer is reflective, transmissive, or semi-transmissive.

19. The photoelectric conversion device of claim 1, wherein the polar polymer in the electron blocking layer forms the complex with the first perovskite compound and the electron blocking layer includes a first perovskite compound layer and a separate polar polymer layer, the polar polymer in the hole blocking layer forms the complex with the second perovskite compound and the hole blocking layer includes a second perovskite compound layer and a separate polar polymer layer, or a combination thereof.

20. An imaging device comprising:
a light irradiation unit,
a photodetector unit, and
a control unit,
the photodetector unit comprising the photoelectric conversion device of claim 1.

21. A method of manufacturing the photoelectric conversion device of claim 1, the method comprising:
forming the first conductive layer;
forming the electron blocking layer comprising the first perovskite compound represented by Formula 1 on the first conductive layer;
forming the photoelectric conversion layer on the electron blocking layer;
forming the hole blocking layer comprising the second perovskite compound represented by Formula 2 on the photoelectric conversion layer; and
forming the second conductive layer on the hole blocking layer.

22. The method of claim 21, wherein the electron blocking layer and the hole blocking layer each independently further comprises a polar polymer.

23. The method of claim 21, wherein the forming of the electron blocking layer comprises:
spin-coating a mixture of a precursor of the first perovskite compound represented by Formula 1 and a polar polymer or a precursor thereof onto the first conductive layer, and
thermally treating a resulting structure at about 100° C. to about 300° C.

24. The method of claim 21, wherein the forming of the photoelectric conversion layer comprises:
adding a non-solvent to a mixture comprising an $A^3$ precursor, a $B^3$ precursor and a solvent and stirring at a temperature of about 70° C. to about 120° C. to prepare a solution of a third perovskite compound represented by Formula 3; and
coating the solution of the third perovskite compound on the electron blocking layer by doctor blade coating or bar coating, $$[A^3][B^3][X^3_{(3-k)}Y^3_k] \quad \text{Formula 3}$$

wherein, in Formula 3,
$A^3$ comprises a monovalent organic cation, a monovalent inorganic cation, or a combination thereof,
$B^3$ comprises a divalent inorganic cation,
$X^3$ and $Y^3$ each independently comprises a monovalent anion, and
k is a real number satisfying 0≤k≤3,
the solvent comprises dimethylformamide, dimethyl sulfoxide, γ-butyrolactone, or a combination thereof, and
the non-solvent comprises α-terpineol, hexyl carbitol, butyl carbitol acetate, hexyl cellosolve, butyl cellosolve acetate, or a combination thereof.

* * * * *